US007727502B2

(12) United States Patent
Leblanc et al.

(10) Patent No.: US 7,727,502 B2
(45) Date of Patent: *Jun. 1, 2010

(54) PROCESS FOR THE PRODUCTION OF MEDIUM AND HIGH PURITY SILICON FROM METALLURGICAL GRADE SILICON

(75) Inventors: Dominic Leblanc, Bécancour (CA); René Boisvert, Trois-Riviéres (CA)

(73) Assignee: Silicum Becancour Inc., Becancour, Quebec (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/047,913

(22) Filed: Mar. 13, 2008

(65) Prior Publication Data

US 2009/0074648 A1    Mar. 19, 2009

Related U.S. Application Data

(60) Provisional application No. 60/960,061, filed on Sep. 13, 2007.

(51) Int. Cl.
*C01B 33/037* (2006.01)
(52) U.S. Cl. ..................................... 423/349
(58) Field of Classification Search ................. 423/349, 423/658.5
See application file for complete search history.

(56) References Cited

U.S. PATENT DOCUMENTS

| | | | |
|---|---|---|---|
| 2,890,139 A | 6/1959 | Shockley | |
| 3,012,865 A | 12/1961 | Pellin | |
| 3,752,221 A * | 8/1973 | Copley et al. | 164/513 |
| 4,094,731 A | 6/1978 | Keyser et al. | |
| 4,200,621 A | 4/1980 | Liaw et al. | |
| 4,242,175 A | 12/1980 | Zumbrunnen | |
| 4,298,423 A | 11/1981 | Lindmayer | |
| 4,304,703 A | 12/1981 | Das | |
| 4,456,480 A | 6/1984 | Wintenberger et al. | |
| 4,539,194 A | 9/1985 | Halvorsen | |
| 4,561,930 A | 12/1985 | Schwirtlich et al. | |
| 4,747,906 A | 5/1988 | Shingu et al. | |
| 5,736,096 A | 4/1998 | Otsuka et al. | |
| 5,788,945 A | 8/1998 | Schei | |
| 5,961,944 A | 10/1999 | Aratani et al. | |
| 5,972,107 A | 10/1999 | Schmid et al. | |
| 6,090,361 A | 7/2000 | Baba et al. | |
| 6,110,274 A | 8/2000 | Okuno | |
| 6,136,091 A | 10/2000 | Yamakazi et al. | |
| 6,299,682 B1 | 10/2001 | Wakita et al. | |
| 2005/0053539 A1 | 3/2005 | Baluais et al. | |
| 2005/0074388 A1 | 4/2005 | Baluais et al. | |
| 2006/0048698 A1* | 3/2006 | Hall et al. | 117/54 |
| 2008/0253955 A1* | 10/2008 | Leblanc et al. | 423/350 |

FOREIGN PATENT DOCUMENTS

| | | |
|---|---|---|
| CN | 1502556 | 6/2004 |
| CN | 1569629 | 1/2005 |
| DE | 3150539 | 6/1983 |
| DE | 3323896 | 1/1985 |
| DE | 3802531 | 8/1989 |
| DE | 3804248 | 8/1989 |
| DE | 3929635 | 3/1991 |
| EP | 0 095 707 | 12/1983 |
| EP | 0 704 559 | 4/1996 |
| FR | 2 831 881 | 5/2003 |
| JP | 1056311 | 3/1989 |
| JP | 5124809 | 5/1993 |
| JP | 5147918 | 6/1993 |
| JP | 5254817 | 10/1993 |
| JP | 7315827 | 12/1995 |
| JP | 8217436 | 8/1996 |
| JP | 10139415 | 5/1998 |
| JP | 10182129 | 7/1998 |
| JP | 10182135 | 7/1998 |
| JP | 10182137 | 7/1998 |
| JP | 10182286 | 7/1998 |
| JP | 10194718 | 7/1998 |
| JP | 10251008 | 9/1998 |
| JP | 10251009 | 9/1998 |
| JP | 10273311 | 10/1998 |
| JP | 10273313 | 10/1998 |
| JP | 11199216 | 7/1999 |
| JP | 2000351616 | 12/2000 |
| JP | 2001278613 | 10/2001 |
| JP | 2003238137 | 8/2003 |

(Continued)

*Primary Examiner*—Timothy C Vanoy
*Assistant Examiner*—Daniel Berns
(74) *Attorney, Agent, or Firm*—Merchant & Gould P.C.

(57) ABSTRACT

A process for purifying low-purity metallurgical grade silicon, contains at least one contaminant and obtains a higher-purity solid polycrystalline silicon. The process includes containing a melt of low-purity metallurgical grade silicon in a mold having insulated bottom and side walls, and an open top; solidifying the melt by unidirectional solidification from the open top towards the bottom wall while electromagnetically stirring the melt; controlling a rate of the unidirectional solidification; stopping the unidirectional solidification when the melt has partially solidified to produce an ingot having an exterior shell including the higher-purity solid polycrystalline silicon and a center including an impurity-enriched liquid silicon; and creating an opening in the exterior shell of the ingot to outflow the impurity-enriched liquid silicon and leave the exterior shell which has the higher-purity solid polycrystalline silicon.

18 Claims, 25 Drawing Sheets

FOREIGN PATENT DOCUMENTS

| WO | WO 97/03922 | 2/1997 |
| WO | WO 03/097528 | 11/2003 |
| WO | WO 2005/061383 | 7/2005 |
| WO | WO 2005/063621 | 7/2005 |
| WO | WO 2006/006436 | 1/2006 |

* cited by examiner

PROCESS FOR THE PRODUCTION OF MEDIUM AND HIGH PURITY SILICON FROM METALLURGICAL GRADE SILICON

FIELD OF THE INVENTION

This invention relates generally to the production of silicon metal, more particularly it concerns a process of purification by crystallization that produces medium and/or high purity silicon metal for use in photovoltaic applications.

BACKGROUND OF THE INVENTION

There are many and varied applications of silicon (Si), each application with its own particular specifications.

Most of the world production of metallurgical grade silicon goes to the steel and automotive industries, where it is used as a crucial alloy component. Metallurgical grade silicon is a silicon of low purity. Typically, metallurgical grade silicon that is about 98% pure silicon is produced via the reaction between carbon (coal, charcoal, pet coke) and silica ($SiO_2$) at a temperature around 1700° C. in a process known as carbothermal reduction.

A small portion of the metallurgical grade Si is diverted to the semiconductor industry for use in the production of Si wafers, etc. However, the semiconductor industry requires silicon of ultra-high purity, e.g. electronic grade silicon (EG-Si) having approximately a 99.9999999% purity (9N). Metallurgical grade silicon must be purified to produce this electronic grade. However, the purification process is elaborate resulting in the higher cost of electronic grade silicon.

The photovoltaic (PV) industry requires silicon of a relatively high degree of purity for the production of photovoltaic cells, i.e. solar cells. The purity requirements of silicon for best performance in solar cell applications are:
- boron (B)<3 ppmw,
- phosphorus (P)<10 ppmw,
- total metallic impurities<300 ppmw and preferably <150 ppmw.

Although the degree of silicon purity required by the photovoltaic industry is less than that of the semiconductor industry, an intermediate grade of silicon, i.e. solar grade (SoG-Si) silicon, with the necessary low boron and low phosphorus content is not readily commercially available. One current alternative is to use expensive ultra-high purity electronic grade silicon; this yields solar cells with efficiencies close to the theoretical limit but at a prohibitive price. Another alternative is to use less expensive "scrap" or off-specification supply of electronic grade silicon from the semiconductor industry. However, improvements in silicon chip productivity have resulted in a decrease in the "scrap" supply of electronic grade silicon available to the PV industry. Moreover, parallel growth of the semiconductor and photovoltaic industries has also contributed to the general short supply of electronic grade silicon.

Several methods of purifying low-grade silicon, i.e. raw silicon or metallurgical grade silicon, are known in the art.

In US 2005/0074388 it is mentioned that:

"For electronic and photovoltaic applications that require high degrees of purity, the method of producing finished products such as photoelectric cells or solar panels comprises a step to produce pure silicon from a basic material that is a silicon essentially with a low content of boron and phosphorus.

For a long time, declassified products derived from the production of electronic silicon have formed the main source of photovoltaic quality silicon, but this source is insufficient to supply the increasing market demand so that other silicon sources are necessary such as metallurgical silicon produced by carbothermal reduction of silica in a submerged electric arc furnace, for which the quality may be improved using various secondary metallurgy refining treatments, for example, refining with chlorine described in patent EP 0.720.967 (Pechiney Electrometallurgie). Thus, a silicon is produced satisfying specifications for example such as the following (% by weight):

Iron<0.30%;

Calcium<0.10%;

Aluminium<0.30%;

Boron 20 to 50 ppm;

Phosphorus 20 to 100 ppm.

The phosphorus content is very dependent on the reduction agents used. With charcoal, it is easy to obtain silicon with a phosphorus content of about 50 ppm; this type of silicon is used particularly for making silicones. With fossil reduction agents, a silicon with a phosphorus content of less than 25 ppm can be produced, for which the main application is manufacturing of aluminium-silicon alloys. However, the purity level of these two grades is still very different from the purity level required for electronic and photovoltaic applications.

Segregated solidification has been known for a long time, and can lower the contents of many impurity elements in silicon. However, this technique is not efficient in achieving the required boron and phosphorus purity levels, starting from the two grades mentioned above.

Thus, under the pressure of the increasing market demand, a large research effort was undertaken to make a silicon with a low boron and phosphorus content starting from metallurgical silicon, particularly using purification of silicon molten under plasma. These plasma treatment techniques were designed on a laboratory scale and it is difficult to transpose them to industrial scale as a result of technical difficulties encountered in making larger tools."

Also known in the art is U.S. Pat. No. 4,094,731, which discloses a process for producing crystalline silicon having an iron concentration less than about one-twentieth of the iron concentration of the mother liquor. Iron-contaminated silicon is introduced into a mould and the mould walls are maintained at a temperature sufficient to cause silicon crystalline growth. The mother liquor is agitated with a carbon rod stirrer or by bubbling a gas to wash the exposed surfaces of the growing silicon crystals and to prevent the freezing of the top surface of the mother liquor. A hollow crystalline silicon ingot is formed and both the inner zone centrally of the crystalline ingot and the outer zone adjacent to the mould wall are removed leaving an inner zone having an iron concentration less than one-twentieth of the iron concentration of the original mother liquor. However, neither boron nor phosphorous is removed by this process.

Over the past years a lot of effort has been put into the development of a process for making solar grade silicon at a competitive cost and on a large-scale. However, there is still a need for a process for the production of solar grade silicon on a large-scale basis.

SUMMARY OF THE INVENTION

An object of the present invention is to provide a process for purifying silicon metal that satisfies the above-mentioned need.

It is also an object of the present invention to provide a process for the production of solar grade silicon directly from metallurgical grade silicon. The specification requirements for silicon are determined by the photovoltaic application and in turn by the photovoltaic cells; the specification requirements for a silicon necessary to obtain the best performances are boron<3 ppmw, phosphorus<10 ppmw, total metallic impurities<300 ppmw and preferably <150 ppmw.

Accordingly, the present invention provides a process for purifying low-purity metallurgical grade silicon, containing at least one of the following contaminants Al, As, Ba, Bi, Ca, Cd, Fe, Co, Cr, Cu, Fe, K, La, Mg, Mn, Mo, Na, Ni, P, Pb, Sb, Sc, Sn, Sr, Ti, V, Zn, Zr, O, C and B, and obtaining a higher-purity solid polycrystalline silicon. The process includes the steps of:

(a) containing a melt of low-purity metallurgical grade silicon in a mould, the mould having an insulated bottom wall, insulated side walls, and an open top;

(b) solidifying the melt by unidirectional solidification from the open top towards the insulated bottom wall of the mould while electromagnetically stirring the melt;

(c) controlling a rate of the unidirectional solidification;

(d) stopping the unidirectional solidification when the melt has partially solidified to produce an ingot having an exterior shell comprising the higher-purity solid polycrystalline silicon and a center comprising an impurity-enriched liquid silicon; and (e) creating an opening in the exterior shell of the ingot to outflow the impurity-enriched liquid silicon and leave the exterior shell comprising said higher-purity solid polycrystalline silicon thereby obtaining the higher-purity solid polycrystalline silicon.

Preferably, the insulated bottom wall and the insulated side walls are heated to minimize a formation of a skin of silicon on the insulated bottom wall and the insulated side walls of the mould.

The rate of unidirectional solidification may be controlled by an insulation of the insulated bottom wall and the insulated side walls. The rate of unidirectional solidification may also be controlled by controlling a rate of heat extraction from the melt at the open top of the mould. Preferably, the controlling a rate of heat extraction may include placing a cooling medium (for example, water or air) in contact with a free surface of the melt at the open top of the mould.

The rate of unidirectional solidification may be adjusted in combination with the stirring power of the electromagnetic stirrer so as to wash the solidification interface and prevent impurity rich liquid to be trapped by dendrite formation and obtain a polycrystalline unidirectional solidification. Preferably, the rate of unidirectional solidification is between $1 \times 10^{-4}$ m/s and $5 \times 10^{-6}$ m/s.

Stopping of the unidirectional solidification is preferably done when 40 to 80% of the melt has solidified.

Creating an opening in the exterior shell of the ingot includes piercing the exterior shell of the ingot. The piercing may be done by mechanical means or thermal lance. Creating an opening in the exterior shell of the ingot may be accomplished through a tap opening in the mould.

The process may further include an additional step before step (e) of removing the ingot from the mould.

Additionally, the process may include a step (f) of melting the higher-purity solid polycrystalline silicon and repeating steps (b) to (e).

In accordance with the process, a top portion of the higher-purity solid polycrystalline silicon may contain approximately at least 90% less metal contaminants Al, As, Ba, Bi, Ca, Cd, Co, Cr, Cu, Fe, K, La, Mg, Mn, Mo, Na, Ni, Pb, Sb, Sc, Sn, Sr, Ti, V, Zn, Zr than the low-purity metallurgical grade silicon. The higher-purity solid polycrystalline silicon may contain approximately at least 45% less phosphorus and approximately at least 10% less boron than the low-purity metallurgical grade silicon. The impurity-enriched liquid silicon contains less than 60 ppmw of carbon and less than 20 ppmw of oxygen and is a low carbon and low oxygen grade of silicon.

The objects, advantages and other features of the present invention will become more apparent and be better understood upon reading of the following non-restrictive description of the invention, given with reference to the accompanying drawings.

DESCRIPTION OF PREFERRED EMBODIMENTS OF THE INVENTION

Figure 1A:
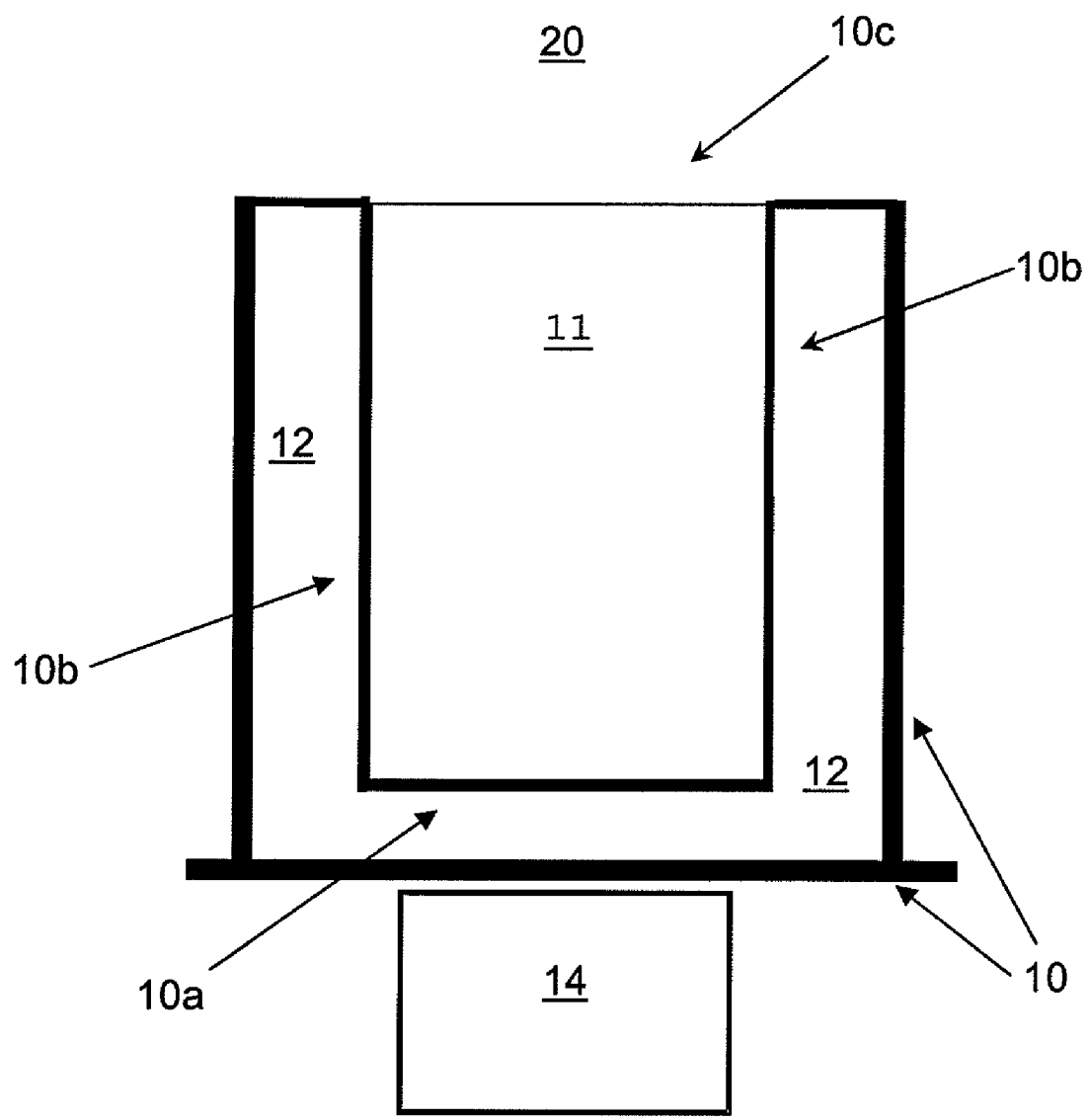
FIG. 1A is a cross-sectional view of a mould containing a melt of low-purity silicon, according to one embodiment of the invention.

While the invention will be described in conjunction with example embodiments, it will be understood that it is not intended to limit the scope of the invention to such embodiments. On the contrary, it is intended to cover all alternatives, modifications and equivalents. The following description is to be read with reference to FIGS. 1A to 10H.

GENERAL DESCRIPTION OF THE INVENTION

As mentioned, the present invention relates to a process of purification by crystallization that produces medium and/or high purity silicon metal for use in photovoltaic applications.

More specifically, in accordance with one aspect of the invention, there is provided a process for purifying low-purity metallurgical grade silicon, containing at least one of the following contaminants Al, As, Ba, Bi, Ca, Cd, Fe, Co, Cr, Cu, Fe, La, Mg, Mn, Mo, Na, Ni, P, Pb, Sb, Sc, Sn, Sr, Ti, V, Zn, Zr, and B, and obtaining a higher-purity solid polycrystalline silicon.

The basic steps of this process are discussed more fully hereinafter with particular reference to FIGS. 1 to 3, and FIG. 6.

(a) Containing a Melt of Low-Purity Metallurgical Grade Silicon in a Mould

Low-purity liquid metallurgical grade silicon is produced by carbothermal reduction of quartz in an electric arc furnace. The liquid silicon (the melt) 11 may be transferred into ladles from where it may be then outpoured into a mould 10 having an insulated bottom wall 10a, insulated side walls 10b, and an open top 10c. The mould 10 may have a rectangular, cylindrical, inverted-bell shape, or any other shape known to a person skilled in the art. It may also have a tap 24 provided thereon (see FIG. 1B).

Figure 1B:
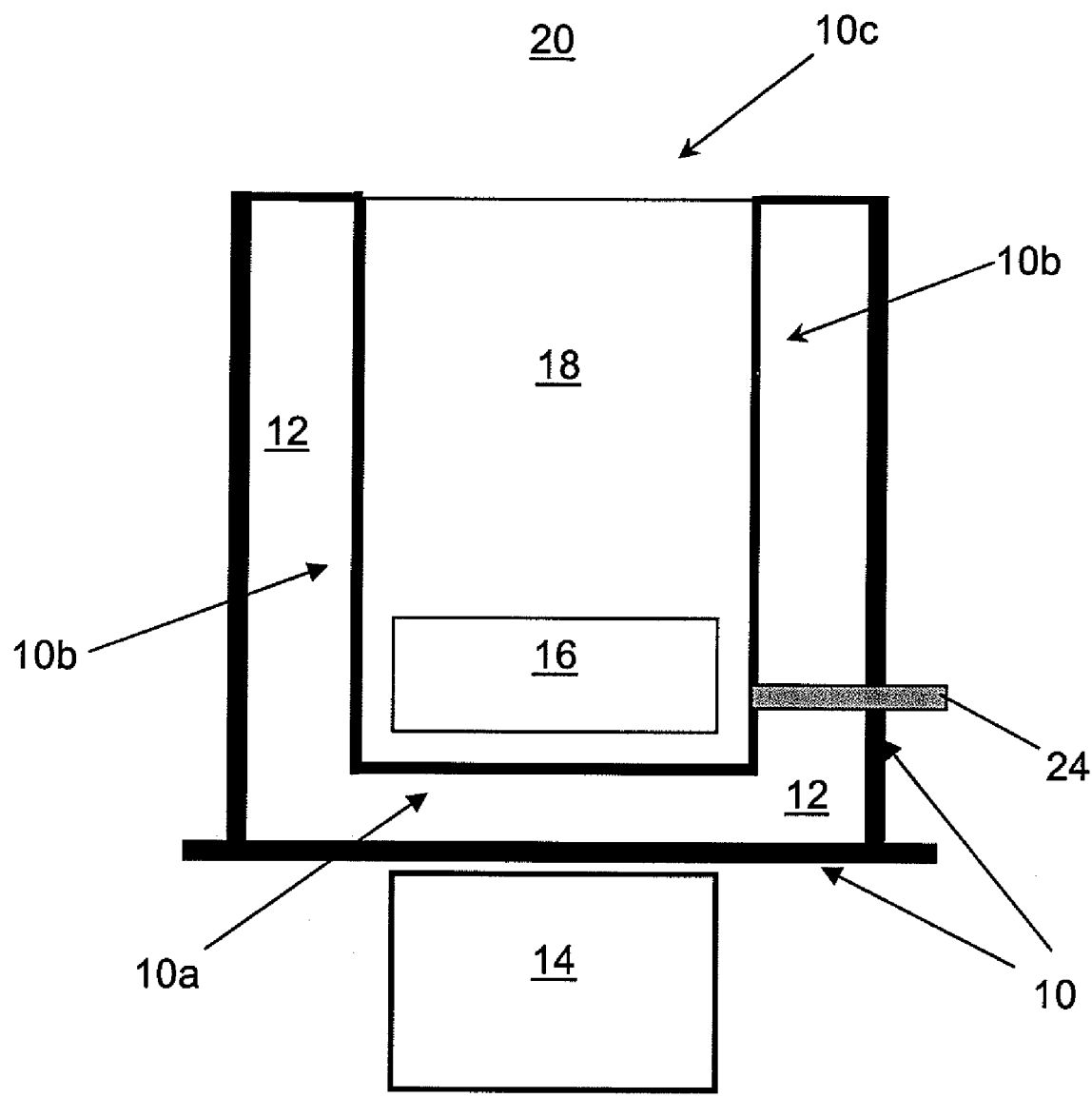
FIG. 1B is a cross-sectional view of the mould of FIG. 1A, showing partial solidification of the melt with a solid silicon exterior shell and a liquid silicon center, according to one embodiment of the invention.

(b) Solidifying the Melt by Unidirectional Solidification from the Open Top Towards the Insulated Bottom Wall of the Mould while Electromagnetically Stirring the Melt In order to obtain an unidirectional solidification, the side walls 10b and bottom wall 10a of the mould are insulated with an appropriate insulation 12, for example silica sand or some appropriate refractory lining, while the top 10c of the mould is open to allow the exposed surface of the melt to emit heat (see FIGS. 1A and 1B). Accordingly, the solidification of the ingot along the side walls 10b and the bottom wall 10a should be negligible compared to that along the top 10c. Heating of the insulation is recommended in order to minimize the thickness of a silicon skin that may solidify and form on the walls of the mould 10.

To ensure a continuous washing of the solidification interface and to dilute the concentration of impurity elements that accumulate at the solidification front, the silicon melt is stirred electromagnetically. The electromagnetic stirring may be provided by any appropriate electromagnetic stirrer 14. FIGS. 1A, 1B, 2, 3, and 6 show a mould with an electromagnetic stirrer placed underneath the mould. Electromagnetic stirring, unlike conventional mechanical stirring, is a non-contact stirring, i.e. no part of the actual stirrer comes into contact with the molten metal.

(c) Controlling a Rate of the Unidirectional Solidification

In order to minimize the quantity of impurity rich liquid silicon trapped by dendrite formation, the rate of unidirectional solidification must be controlled. Preferably, the rate of unidirectional solidification is less than $1 \times 10^{-4}$ m/s or even more preferably comprised between $1 \times 10^{-4}$ m/s and $5 \times 10^{-6}$ m/s.

The rate of unidirectional solidification may be controlled by controlling the rate of heat extraction from the open top 10c of the mould 10. It should be noted that the term "heat extraction" is understood to include heat removal and simple heat emission. This may be accomplished with the type of insulation used for the bottom and side walls as well as by placing the free surface of the melt at the open top of the mould in contact with a cooling medium 20, such as air or water. For example, the solidification can be slowed by using a light insulation or accelerated by using a water shower to cool the exposed free surface of the melt.

(d) Stopping the Unidirectional Solidification when the Melt has Partially Solidified When 40 to 80% of the melt has solidified, the unidirectional solidification is stopped thus obtaining an ingot 19 having an exterior shell made of higher-purity solid polycrystalline silicon 18 and a center made of an impurity-enriched liquid silicon 16. Stopping the unidirectional solidification simply implies not allowing the melt to completely solidify and proceeding to the next step.

(e) Obtaining the Higher-Purity Solid Polycrystalline Silicon

Once 40 to 80% of the melt has solidified, a crack or an opening 22 is created in the exterior shell of the ingot 19 to outflow the impurity-enriched liquid silicon 16 from the center and leave behind the exterior shell of higher-purity solid polycrystalline silicon 18.

The liquid silicon 16 may be extracted from the center of the ingot 19 by piercing the exterior shell of the ingot 19, for example by mechanical means or thermal lance, to create an opening 22 in the exterior shell of the ingot 19 through which the liquid silicon may be extracted.

The actual extraction of the liquid silicon 16 from the ingot 19 may be done by tapping the ingot through a tap 24 found in the mould 10 (see FIG. 1B), either in the bottom wall 10a of the mould 10 or a side wall 10b. For example, a thermal lance may be used to create an opening in the exterior shell of the ingot through the tap 24 in the mould 10 to outpour the liquid silicon 16.

Figure 2:
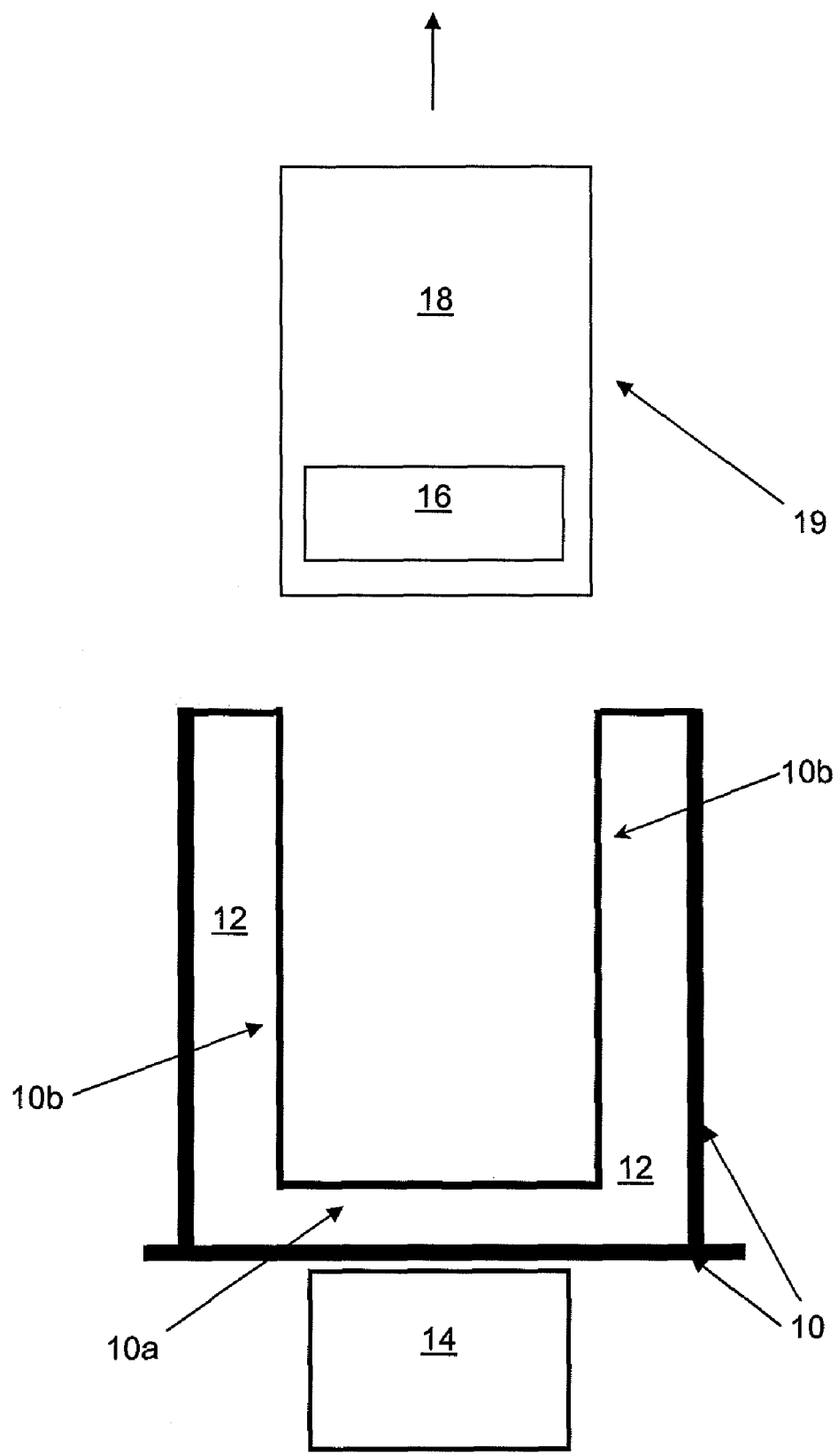
FIG. 2 is a schematic representation of a cross-sectional view of the mould and ingot of FIG. 1B, showing removal of the ingot from the mould, according to one embodiment of the invention.
Figure 3:
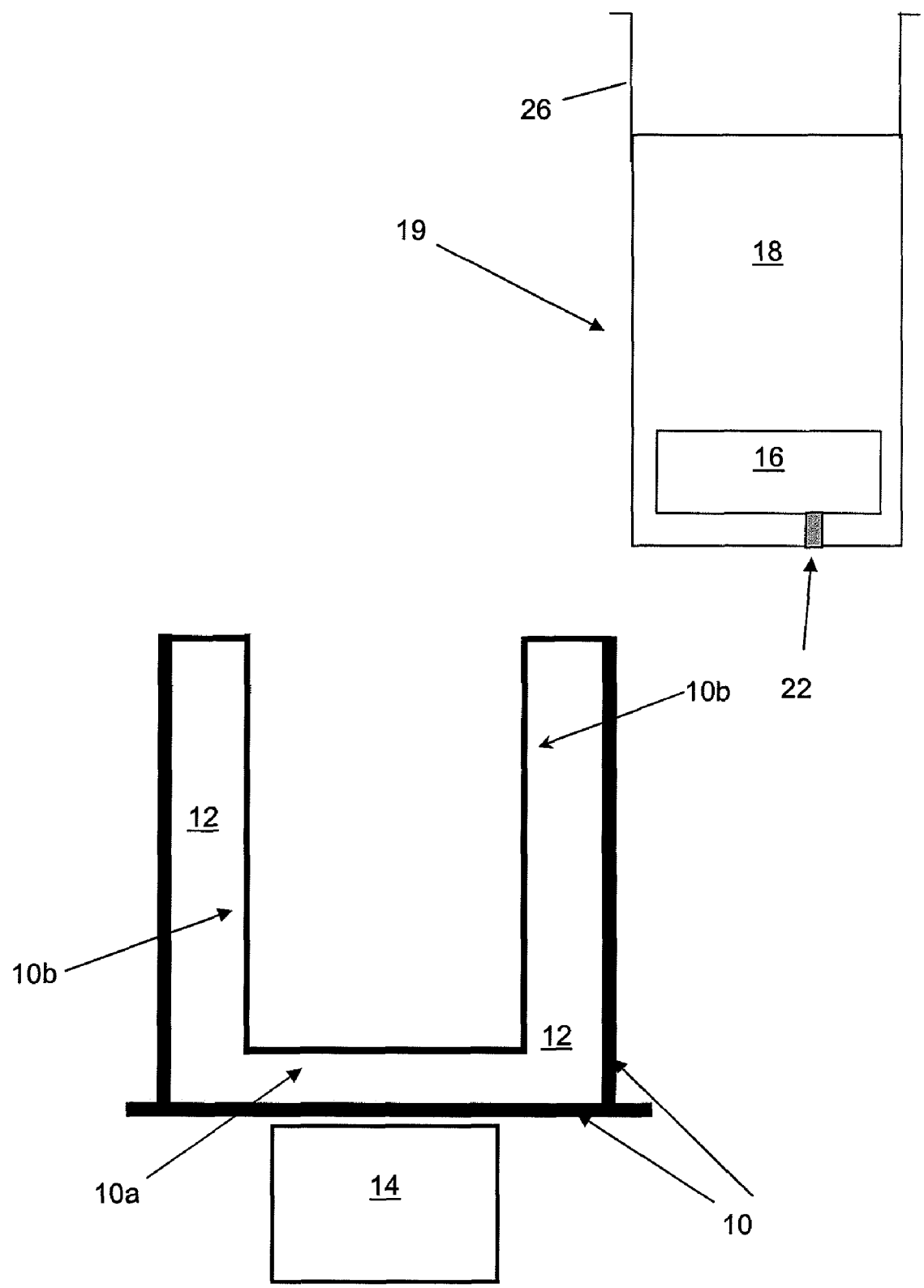
FIG. 3 is a schematic representation of a cross-sectional view of the mould and ingot of FIG. 1B, showing removal of the ingot from the mould and the creation of an opening in the exterior shell of the ingot, according to one embodiment of the invention.

The process may further include an additional step before step (e) of removing the ingot 19 from the mould 10 (see FIG. 2), for example by lifting the ingot 19 out of the mould 10 using an appropriate suspension mechanism 26 (see FIG. 3). For example, in this way, while the ingot 19 is suspended in mid-air, the bottom portion of the ingot 19 is caused to crack, by piercing or quenching, to draw off the liquid silicon 16.

A top portion of the higher-purity solid polycrystalline silicon thus obtained may contain approximately at least 90% less of contaminants Al, As, Ba, Bi, Ca, Cd, Co, Cr, Cu, Fe, K, La, Mg, Mn, Mo, Na, Ni, Pb, Sb, Sc, Sn, Sr, Ti, V, Zn, Zr than the silicon starting material.

The higher-purity solid polycrystalline silicon may contain approximately at least 45% less phosphorus and approximately at least 10% less boron than the metallurgical grade silicon starting material.

Advantageously, the impurity-enriched liquid silicon may contain less than 60 ppmw of carbon and less than 20 ppmw of oxygen and thus may provide a low carbon and low oxygen grade of silicon.

Of course, the entire process—from step (a) to (e)—may be repeated using the higher purity solid polycrystalline silicon, a so-called medium purity silicon, as starting material to thereby obtain a final silicon material of an even higher purity, a so-called high purity silicon. In this way, solar grade silicon may be obtained from metallurgical grade silicon.

DETAILED DESCRIPTION OF THE INVENTION

1. Directional Solidification 1.1 Dendritic Solidification

Figure 4:
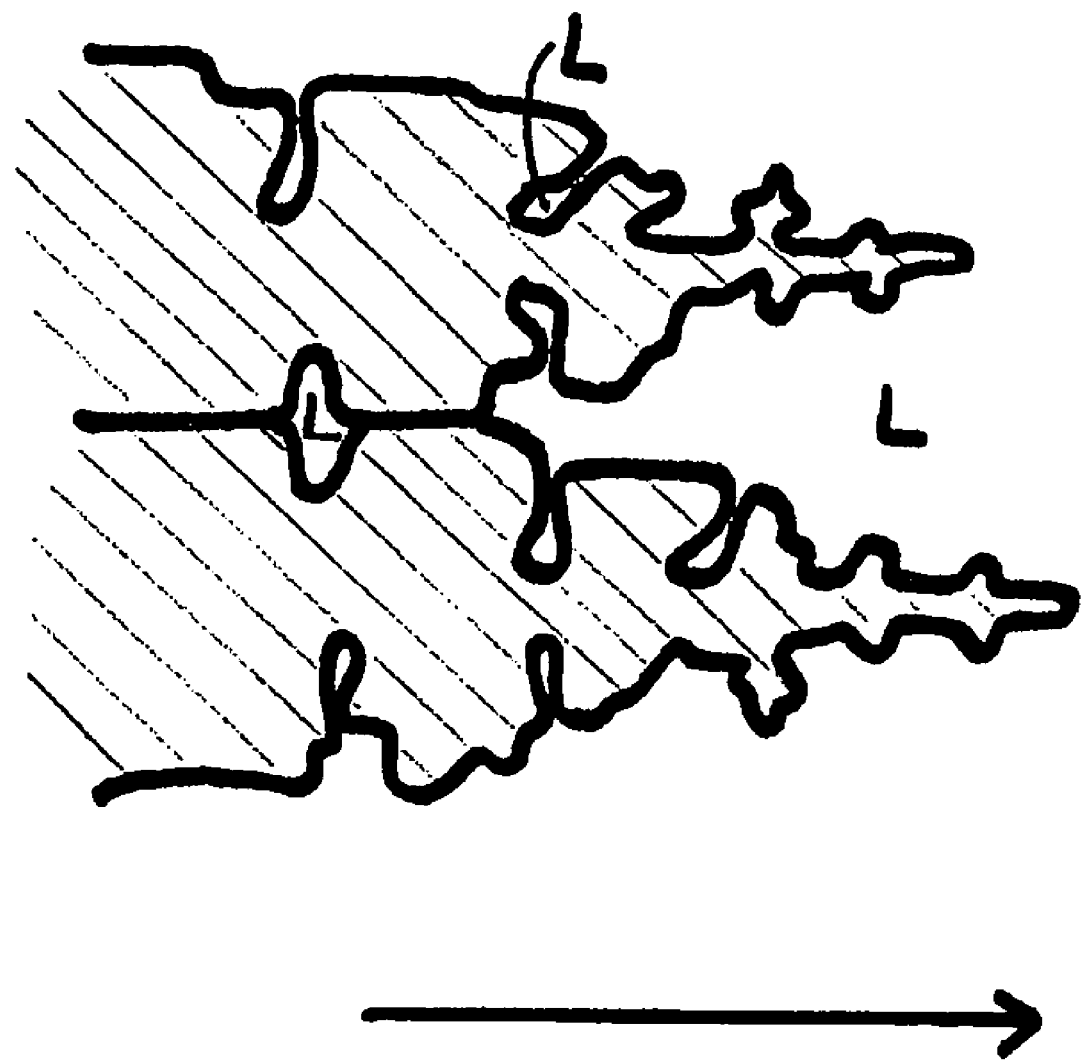
FIG. 4 is a schematic representation of dendritic growth during solidification of a liquid. [PRIOR ART]

Directional solidification is a common method of purification. Metallurgical grade silicon contains a significant level of impurities which favours structural supercooling during solidification. When there is a presence of supercooling during solidification of a liquid metal, the type of solidification is dendritic, as shown in FIG. 4. Dendritic solidification is a very inefficient directional solidification—a certain quantity of impurity-rich liquid (L) is trapped during solidification by the dendritic arms.

With no electromagnetic agitation of the melt during solidification of the melt, 50% of the initial liquid is trapped by the dendritic arms. This gives us a purification efficiency of:

$$[El]_{solid} = (1-R) \cdot k_{th} \cdot [El]_{liquid} + R \cdot [El]_{liquid} = k_{eff} \cdot [El]_{liquid}$$

$$k_{eff} = (1-R) \cdot k_{th} + R$$

where
- $[El]_{solid}$: concentration of the solute in the solid metal;
- $[El]_{liquid}$: concentration of the solute in the liquid metal;
- R: fraction of the impure melt trapped in the solid metal during crystallization;
- $k_{th}$: segregation coefficient determined by Czochralski crystallization of silicon;
- $k_{eff}$ segregation coefficient determined by our new process.

A sampling of the solidified melt of metallurgical grade silicon, taken from the surface of the ingot, yields the following information:

$$\frac{0.17\% \text{ Fe}}{0.35\% \text{ Fe}} = (1-R) \cdot 0.0000064 + R$$

thus, $R = 0.49 \approx 0.50$

The constant R is valid for all elements for this particular technique.

Some examples:

$$[Fe]_{solid} = (1-0.50) \cdot 0.0000064 \cdot [Fe]_{liquid} + 0.50 \cdot [Fe]_{liquid} = 0.50 \cdot [Fe]_{liquid}$$

$$[P]_{solid} = (1-0.50) \cdot 0.35 \cdot [P]_{liquid} + 0.50 \cdot [P]_{liquid} = 0.68 \cdot [P]_{liquid}$$

$$[B]_{solid} = (1-0.50) \cdot 0.80 \cdot [B]_{liquid} + 0.50 \cdot [B]_{liquid} = 0.90 \cdot [B]_{liquid}$$

TABLE 1

| Element | $k_{eff}$ |
|---|---|
| Al | 0.50 |
| Ca | 0.50 |
| Co | 0.50 |
| Cr | 0.50 |
| Cu | 0.50 |
| Fe | 0.50 |
| Mg | 0.50 |
| Mn | 0.50 |
| Mo | 0.50 |
| Ni | 0.50 |
| P | 0.68 |
| Ti | 0.50 |
| V | 0.50 |
| Zr | 0.50 |
| B | 0.90 |

A purification efficiency of approximately 50% is obtained for a majority of the elements (except boron and phosphorus). In fact, about 30% of the phosphorus and 10% of boron can be removed by our technique of large mould segregation by directional solidification without electromagnetic stirring.

The partition (segregation) coefficient ($k_{eff}$) stays the same during solidification however the composition of the liquid at equilibrium with the solid increases in solute content. The Scheil equation describes well this phenomenon.

1.2 The Scheil Equation

The composition of the solid at the solidification interface is, according to the Scheil equation (diffusion and convection in the liquid, no diffusion in the solid):

$$C_s = k \cdot C_o \cdot (1-f_s)^{k-1}$$

where
- $C_s$: Concentration of the solute in the solid;
- $C_0$: Initial concentration of the solute in the liquid;
- k: Segregation coefficient;
- $f_s$: Solid fraction.

Therefore, if the solidification is stopped at a specific moment and an analysis of the solid on average is carried out, the average concentration of the solute in the solid portion is:

$$\overline{C_S} = \frac{1}{f_s} \int_0^{f_s} k \cdot C_o \cdot (1-x)^{k-1} \cdot dx$$

$$\overline{C_S} = C_o \cdot \frac{1-(1-f_s)^k}{f_s}$$

Figure 5:
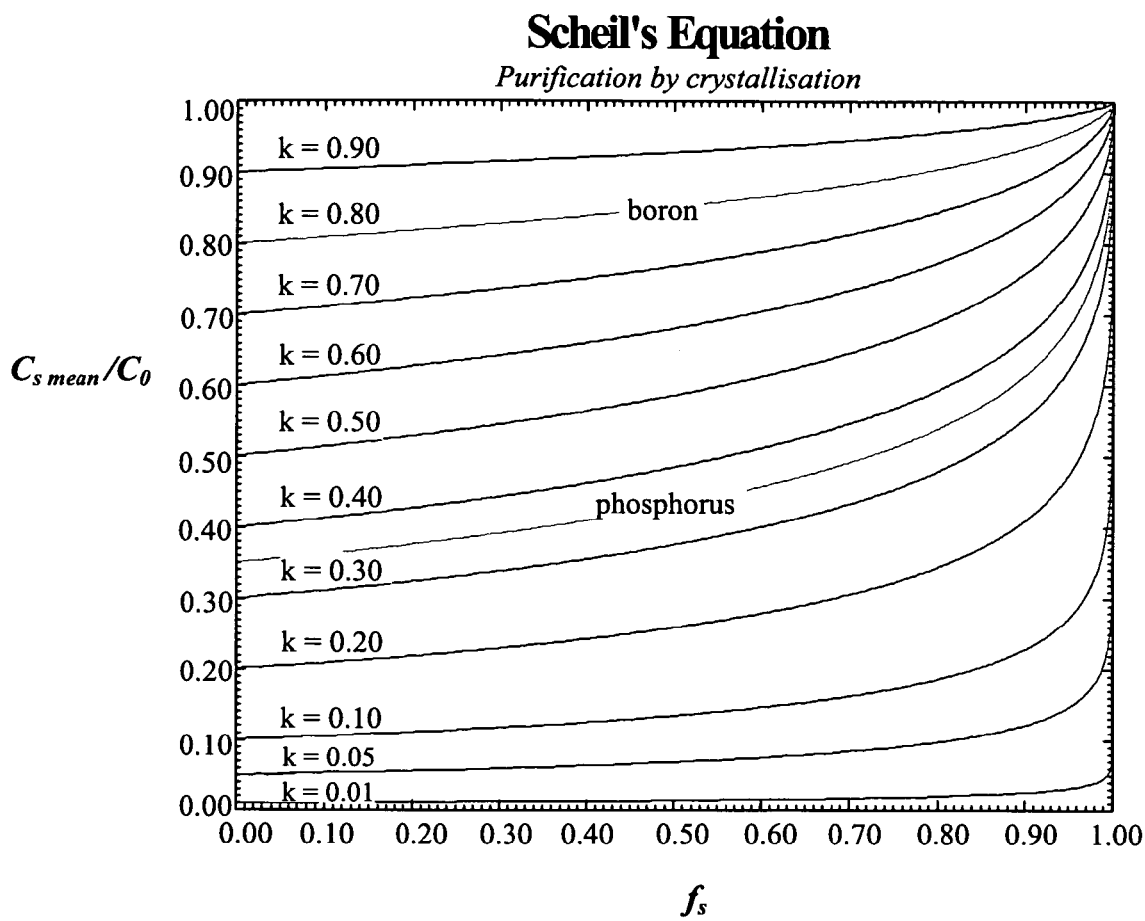
FIG. 5 is a graphical representation of the Scheil equation. [PRIOR ART]

A graphical representation of the above equation is given in FIG. 5.

It is worth noting that depending on the solid fraction, the average efficiency of the purification is affected. The first solid formed is the most pure. When the solidification is stopped and a global chemical analysis of the solid is performed, the efficiency is slightly lower because of the increase in the concentration of the liquid in solute. This explains well the experimental results observed after complete solidification of a silicon ingot (but only the layer solidified from the upper surface of the ingot).

It is noted that when solidification is carried out without agitation of the liquid (melt), the lower part of the ingot is typically richer in impurities than the upper part. An explanation for this could possibly be found in the difference in densities between the (cooler) impurity-rich liquid and that of the center of the ingot: the composition of the liquid is not homogeneous.

When the melt is only partially solidified, the liquid may be separated from the solid by creating an opening or a crack in the shell for example by piercing the shell of the ingot (for example: by thermal lance, mechanical piercing, or other). The opening or crack may be obtained by solidifying the silicon in a mould provided with a closable outlet in the bottom portion. Once the liquid has solidified to the required degree, the outlet is opened and the shell pierced to draw off the liquid. As shown in the embodiments of FIGS. 1 to 3, the opening or crack can also be obtained by lifting up the shell from the mould with an appropriate suspension system. While the shell is in suspension in the air, the bottom portion is caused to crack by piercing or quenching to draw off the liquid. The ingot could also be completely solidified so as to then remove the portions that are of interest chemically. The mould may have a rectangular or cylindrical shape. It could also have the shape of upside down bell or any other shape known to a person skilled in the art. (See FIGS. 1 to 3)

The final silicon solid contains fewer impurities (i.e. is depleted of impurities) while the liquid at the center of the ingot is enriched in impurities.

EXAMPLE

We want to obtain the concentration of iron in the solid and in the liquid upon solidification of 70% of the silicon melt (time of solidification: 4.5 hours). The quantity of liquid silicon is 5.0 mt and the composition of the liquid silicon includes 0.35% Fe.

$$k_{sol}^{Fe} = f(k_{eff}^{Fe}, f_s)$$

$k_{sol}^{Fe} = 0.65$, obtained from FIG. 5.

By taking into account the mass distribution we obtain:

$$k_{liq}^{Fe} = \frac{1 - k_{sol}^{Fe} \cdot f_s}{1 - f_s} = \frac{1 - 0.65 \cdot 0.70}{1 - 0.70}$$

$$k_{liq}^{Fe} = 1.82$$

Therefore, after treatment, we obtain:
⇒3.5 mt of solid silicon at 0.23% Fe
⇒1.5 mt of liquid silicon at 0.64% Fe

1.3 Minimizing Dendritic Formation

During solidification, the dendrites trap impurity-rich liquid coming from a diffusion layer at the solid/liquid interface.

To minimize the presence of dendrites, a planar solidification front may be promoted. A certain quantity of solute may be trapped with planar solidification, but this quantity is far less than that trapped during dendritic solidification. A planar directional solidification may be promoted by allowing heat to escape from a single surface of the ingot.

In addition, to homogenize the impurity-rich liquid and break down the diffusion layer at the solid/liquid interface, the liquid should preferably be agitated, stirred.

2. Polycrystalline Directional Solidification with Agitation

In order to obtain a substantially polycrystalline unidirectional solidification, the walls of the mould may be insulated (as shown in FIGS. 1 to 3) while the top may be open to allow heat to be emitted therefrom (the solidification of the melt can be slowed by a light insulation or accelerated by a water shower). Accordingly, the solidification along the walls and the bottom should be negligible compared to that along the top of the ingot (heating of the insulation is recommended in order to minimize the thickness of the silicon skin solidified on the walls of the mould).

The present invention involves the use of an electromagnetic stirrer. Electromagnetic stirrers are known for stirring molten metal. For example, they are used to stir aluminum as it melts in a furnace. The electromagnetic stirrer utilizes the principle of a linear motor and differs from the conventional mechanical and decompression types as it is a non-contact stirrer in which no part touches the molten metal (see FIG. 6).

Figure 6:
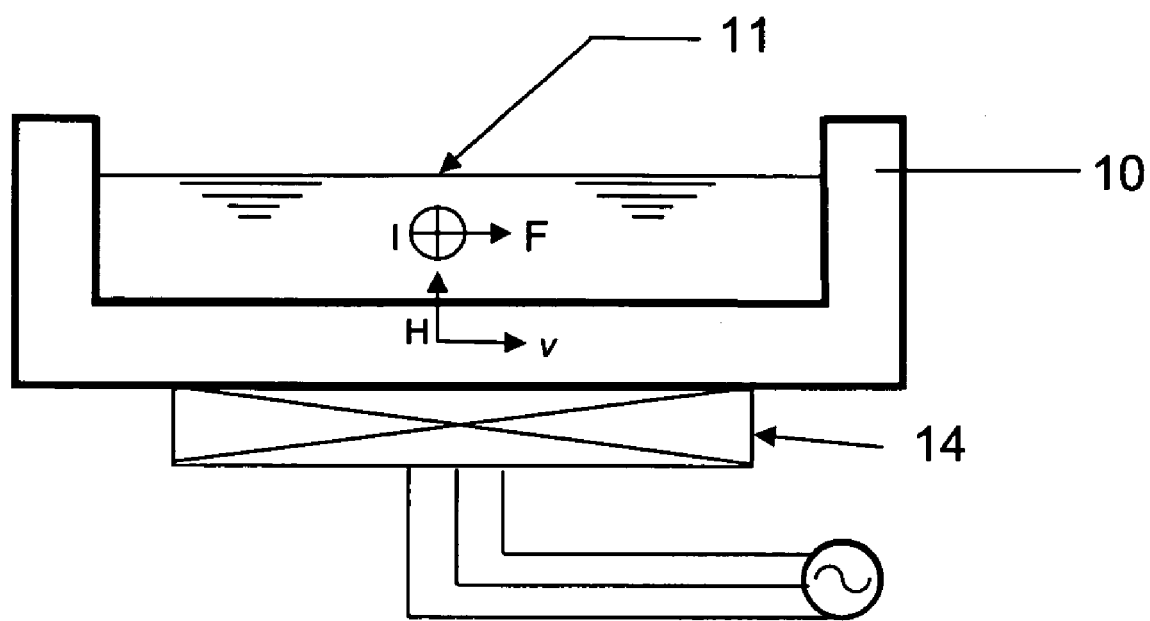
FIG. 6 is a cross-sectional view of a mould containing a melt and of an electromagnetic stirrer used to stir the melt.

As shown in FIG. 6, a coil installed at the bottom of the mould generates a moving magnetic field (H) when a 3-phase AC voltage is applied to this coil (inductor). Electric power force is generated in the molten metal due to the action of the magnetic field (magnetic flux) and causes induction current (I) to flow. This current then acts with the magnetic field of the inductor to induce electromagnetic force (F) in the molten metal. As this thrust moves in the direction of the moving magnetic field, the molten metal also moves. In other words, a stirring action is applied. Furthermore, as this thrust has components in the horizontal direction and in the vertical direction, the molten metal flows diagonally upwards resulting in a uniform temperature and chemical composition in both the top and bottom layers of the molten metal.

2.3 Preliminary Calculations

The speed of the solidification interface is fixed by the rate of heat loss. For a surface without insulation (the upper portion of the ingot) the thickness of the solid silicon and the rate of solidification in ambient air are (from experiment):

$$E = 134 \frac{mm}{\sqrt{hr}} \cdot \sqrt{t}$$

$$v = \frac{dE}{dt} = 67 \frac{mm}{\sqrt{hr}} \cdot \frac{1}{\sqrt{t}}$$

where E is the thickness of the top solid layer of the ingot, v is the rate of solidification at the interface, and t is the total time of solidification.

2.4 Experiments

2.4.1 Experiment #1: Agitation-Free Solidification (Control Experiment)

2.4.1.1 Ingot Sample

A control experiment was carried out: unidirectional solidification in an insulated mould without electromagnetic stirring of the melt during solidification.

Figure 7:
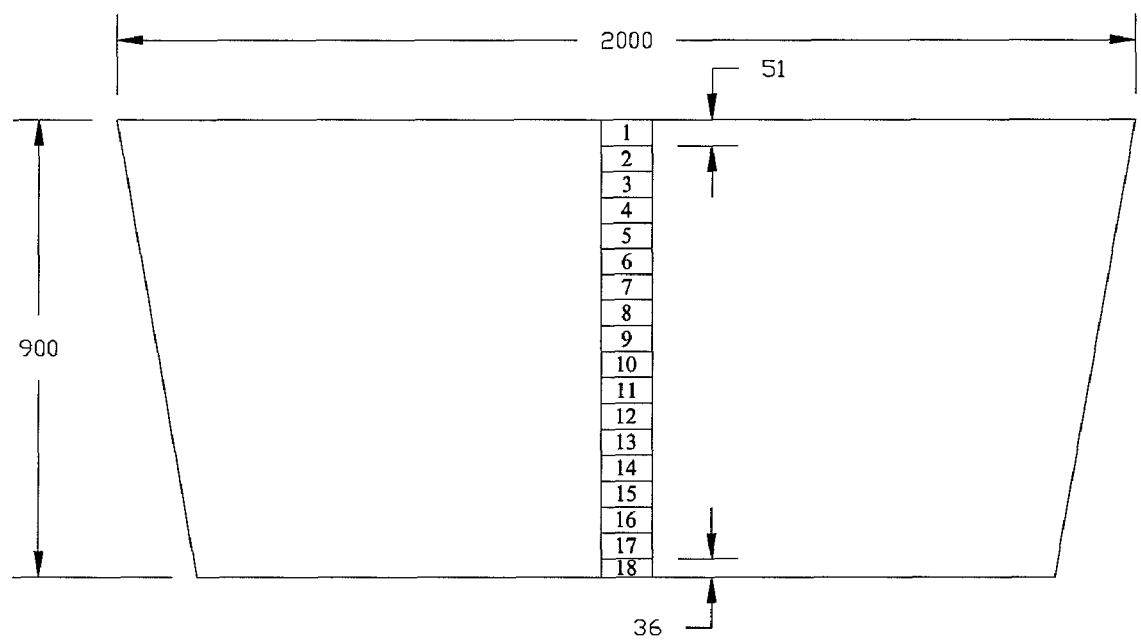
FIG. 7 is a graphical representation of the location within an ingot of samples analyzed for a solidification trial without electromagnetic stirring.
Figure 8A:
FIGS. 8A to 8H are graphical representations for various elements of the elemental distribution as a function of the location in the ingot as depicted in FIG. 7.
Figure 8B:
Figure 8C:
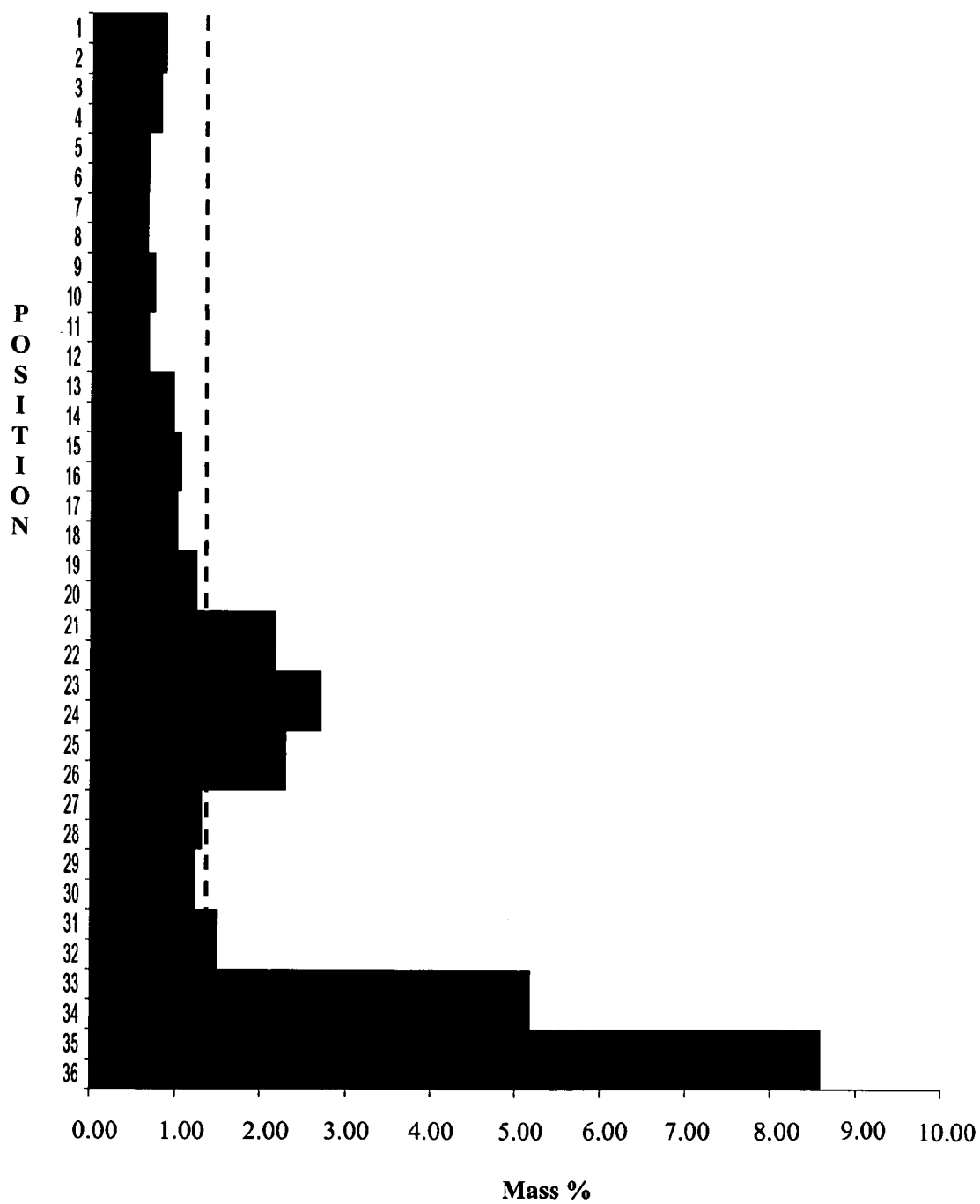
Figure 8D:
Figure 8E:
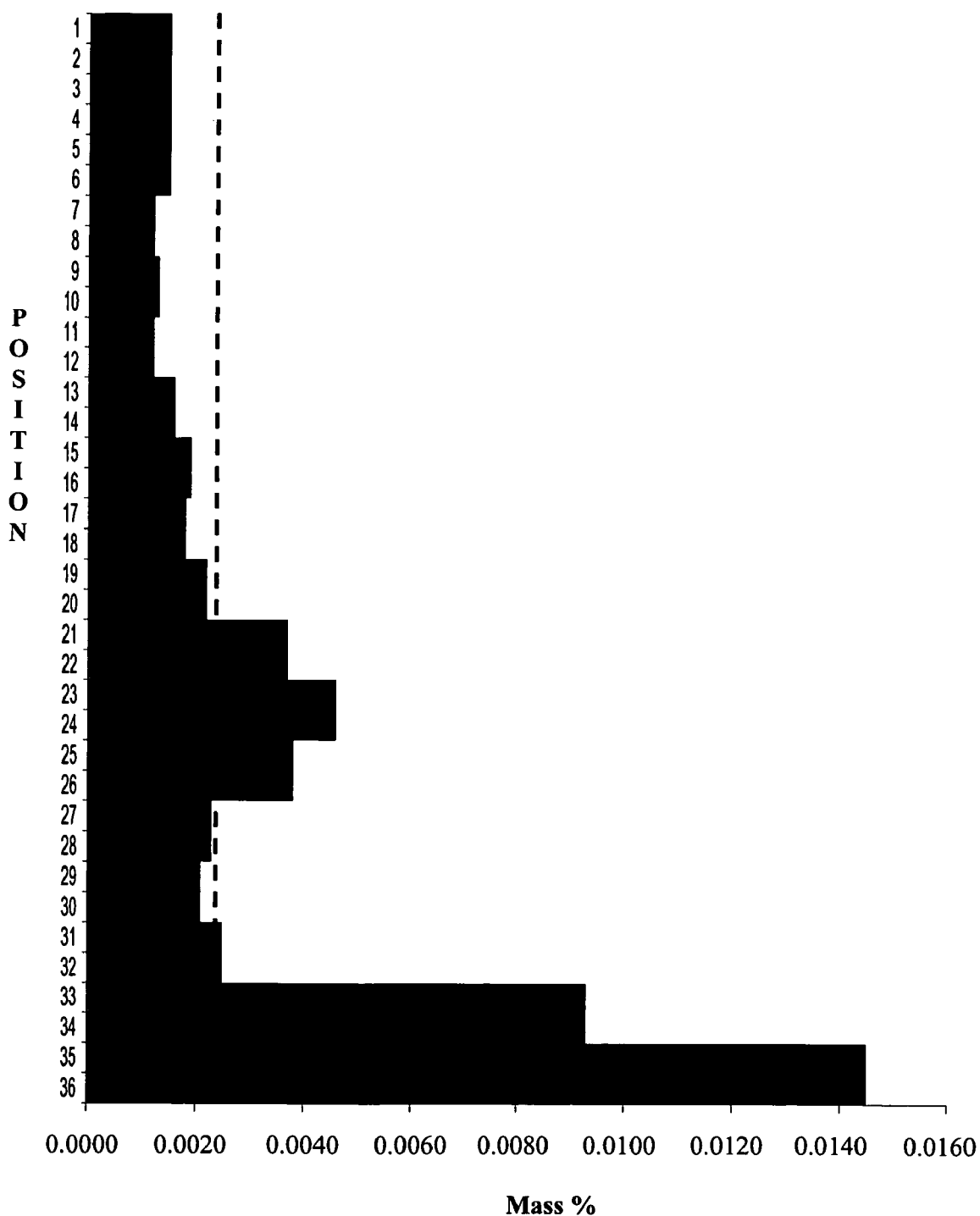
Figure 8F:
Figure 8G:
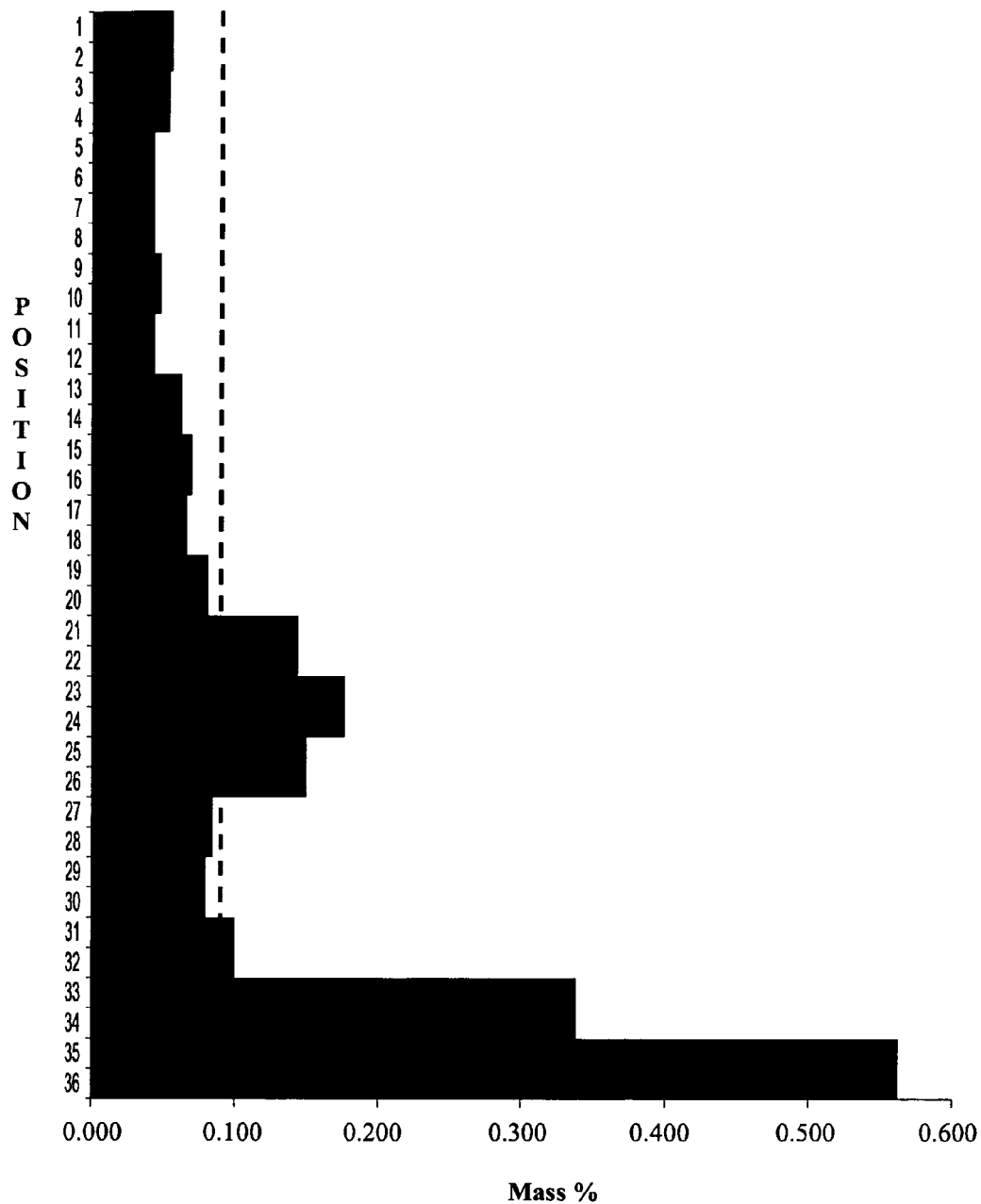
Figure 8H:

A sample was taken from the center of the ingot, according to the diagram shown in FIG. 7, and analyzed the results are given hereinbelow in Table 2. A graphical representation of the elemental impurity distribution in the ingot as a function of position in the ingot of several of the elements is shown in FIGS. 8A to 8H.

TABLE 2

|    | Liq.   | 1      | 2      | 3      | 4      | 5      | 6      | 7      | 8      | 9      |
|----|--------|--------|--------|--------|--------|--------|--------|--------|--------|--------|
| Al | 0.3028 | 0.1689 | 0.1641 | 0.1290 | 0.1397 | 0.1476 | 0.1295 | 0.3336 | 0.5828 | 0.1969 |
| As | 0.0050 | 0.0030 | 0.0029 | 0.0025 | 0.0024 | 0.0029 | 0.0028 | 0.0038 | 0.0044 | 0.0037 |
| Ba | 0.0011 | 0.0005 | 0.0005 | 0.0003 | 0.0005 | 0.0005 | 0.0003 | 0.0031 | 0.0084 | 0.0005 |
| Bi | 0.0002 | 0.0003 | 0.0002 | 0.0002 | 0.0002 | 0.0001 | 0.0002 | 0.0003 | 0.0004 | 0.0003 |
| Ca | 0.0742 | 0.0313 | 0.0321 | 0.0211 | 0.0317 | 0.0299 | 0.0187 | 0.2393 | 0.6633 | 0.0258 |
| Cd | 0.0001 | 0.0001 | 0.0001 | 0.0001 | 0.0001 | 0.0001 | 0.0001 | 0.0001 | 0.0001 | 0.0001 |
| Co | 0.0007 | 0.0006 | 0.0006 | 0.0005 | 0.0005 | 0.0005 | 0.0005 | 0.0006 | 0.0008 | 0.0006 |
| Cr | 0.0037 | 0.0025 | 0.0022 | 0.0023 | 0.0018 | 0.0020 | 0.0020 | 0.0026 | 0.0030 | 0.0027 |
| Cu | 0.0043 | 0.0027 | 0.0025 | 0.0020 | 0.0021 | 0.0023 | 0.0021 | 0.0031 | 0.0034 | 0.0032 |
| Fe | 1.3665 | 0.8744 | 0.8224 | 0.6788 | 0.6707 | 0.7498 | 0.6853 | 0.9783 | 1.0696 | 1.0273 |
| La | 0.0033 | 0.0021 | 0.0020 | 0.0017 | 0.0017 | 0.0019 | 0.0017 | 0.0026 | 0.0034 | 0.0025 |
| Mg | 0.0010 | 0.0005 | 0.0005 | 0.0004 | 0.0004 | 0.0005 | 0.0004 | 0.0012 | 0.0026 | 0.0007 |
| Mn | 0.0238 | 0.0174 | 0.0141 | 0.0117 | 0.0116 | 0.0136 | 0.0118 | 0.0168 | 0.0197 | 0.0181 |
| Mo | 0.0012 | 0.0015 | 0.0020 | 0.0005 | 0.0009 | 0.0015 | 0.0013 | 0.0010 | 0.0019 | 0.0010 |
| Na | 0.0001 | 0.0001 | 0.0001 | 0.0001 | 0.0001 | 0.0001 | 0.0001 | 0.0001 | 0.0001 | 0.0001 |
| Ni | 0.0024 | 0.0015 | 0.0015 | 0.0015 | 0.0012 | 0.0013 | 0.0012 | 0.0016 | 0.0019 | 0.0018 |
| P  | 0.0047 | 0.0034 | 0.0039 | 0.0038 | 0.0033 | 0.0032 | 0.0032 | 0.0039 | 0.0045 | 0.0049 |
| Pb | 0.0007 | 0.0004 | 0.0003 | 0.0005 | 0.0006 | 0.0002 | 0.0004 | 0.0004 | 0.0006 | 0.0004 |
| Sb | 0.0028 | 0.0018 | 0.0015 | 0.0012 | 0.0014 | 0.0014 | 0.0013 | 0.0029 | 0.0042 | 0.0021 |
| Sc | 0.0001 | 0.0001 | 0.0001 | 0.0001 | 0.0001 | 0.0001 | 0.0001 | 0.0001 | 0.0002 | 0.0001 |
| Sn | 0.0006 | 0.0001 | 0.0005 | 0.0008 | 0.0002 | 0.0001 | 0.0006 | 0.0003 | 0.0007 | 0.0004 |
| Sr | 0.0008 | 0.0003 | 0.0003 | 0.0002 | 0.0003 | 0.0003 | 0.0002 | 0.0027 | 0.0078 | 0.0002 |

TABLE 2-continued

| | | | | | | | | | | |
|---|---|---|---|---|---|---|---|---|---|---|
| Ti | 0.0893 | 0.0554 | 0.0536 | 0.0432 | 0.0433 | 0.0482 | 0.0440 | 0.0627 | 0.0695 | 0.0663 |
| V | 0.0018 | 0.0011 | 0.0011 | 0.0009 | 0.0009 | 0.0010 | 0.0009 | 0.0013 | 0.0015 | 0.0013 |
| Zn | 0.0006 | 0.0004 | 0.0004 | 0.0003 | 0.0003 | 0.0003 | 0.0003 | 0.0008 | 0.0005 | 0.0005 |
| Zr | 0.0177 | 0.0112 | 0.0108 | 0.0089 | 0.0088 | 0.0098 | 0.0090 | 0.0125 | 0.0136 | 0.0133 |
| B | 0.0039 | 0.0036 | 0.0036 | 0.0036 | 0.0036 | 0.0035 | 0.0036 | 0.0038 | 0.0041 | 0.0042 |

| | 10 | 11 | 12 | 13 | 14 | 15 | 16 | 17 | 18 |
|---|---|---|---|---|---|---|---|---|---|
| Al | 0.2420 | 0.4253 | 0.5233 | 0.4394 | 0.2552 | 0.2826 | 0.2858 | 0.4562 | 1.6030 |
| As | 0.0046 | 0.0078 | 0.0097 | 0.0084 | 0.0047 | 0.0044 | 0.0053 | 0.0174 | 0.0299 |
| Ba | 0.0006 | 0.0010 | 0.0012 | 0.0011 | 0.0006 | 0.0012 | 0.0013 | 0.0023 | 0.0089 |
| Bi | 0.0004 | 0.0006 | 0.0009 | 0.0009 | 0.0005 | 0.0004 | 0.0005 | 0.0016 | 0.0025 |
| Ca | 0.0314 | 0.0550 | 0.0672 | 0.0572 | 0.0334 | 0.0893 | 0.0882 | 0.1806 | 0.4187 |
| Cd | 0.0001 | 0.0001 | 0.0001 | 0.0001 | 0.0001 | 0.0001 | 0.0001 | 0.0001 | 0.0001 |
| Co | 0.0007 | 0.0012 | 0.0012 | 0.0010 | 0.0008 | 0.0007 | 0.0008 | 0.0021 | 0.0032 |
| Cr | 0.0034 | 0.0057 | 0.0070 | 0.0059 | 0.0035 | 0.0033 | 0.0040 | 0.0131 | 0.0209 |
| Cu | 0.0040 | 0.0071 | 0.0088 | 0.0074 | 0.0042 | 0.0038 | 0.0046 | 0.0165 | 0.0278 |
| Fe | 1.2536 | 2.1771 | 2.7017 | 2.2976 | 1.3181 | 1.2426 | 1.5025 | 5.1867 | 8.5841 |
| La | 0.0029 | 0.0050 | 0.0061 | 0.0052 | 0.0038 | 0.0030 | 0.0036 | 0.0123 | 0.0190 |
| Mg | 0.0008 | 0.0014 | 0.0015 | 0.0014 | 0.0008 | 0.0009 | 0.0012 | 0.0063 | 0.0170 |
| Mn | 0.0232 | 0.0386 | 0.0483 | 0.0405 | 0.0236 | 0.0226 | 0.0264 | 0.0930 | 0.1550 |
| Mo | 0.0010 | 0.0013 | 0.0012 | 0.0012 | 0.0011 | 0.0010 | 0.0005 | 0.0022 | 0.0029 |
| Na | 0.0001 | 0.0001 | 0.0001 | 0.0001 | 0.0001 | 0.0001 | 0.0001 | 0.0097 | 0.0915 |
| Ni | 0.0022 | 0.0037 | 0.0046 | 0.0038 | 0.0023 | 0.0021 | 0.0025 | 0.0093 | 0.0145 |
| P | 0.0061 | 0.0082 | 0.0084 | 0.0078 | 0.0053 | 0.0046 | 0.0047 | 0.0077 | 0.0121 |
| Pb | 0.0002 | 0.0005 | 0.0005 | 0.0004 | 0.0004 | 0.0003 | 0.0005 | 0.0009 | 0.0014 |
| Sb | 0.0023 | 0.0042 | 0.0050 | 0.0043 | 0.0027 | 0.0024 | 0.0029 | 0.0064 | 0.0148 |
| Sc | 0.0001 | 0.0002 | 0.0002 | 0.0002 | 0.0001 | 0.0001 | 0.0002 | 0.0005 | 0.0009 |
| Sn | 0.0005 | 0.0001 | 0.0006 | 0.0009 | 0.0004 | 0.0001 | 0.0005 | 0.0008 | 0.0004 |
| Sr | 0.0003 | 0.0006 | 0.0007 | 0.0006 | 0.0003 | 0.0009 | 0.0010 | 0.0020 | 0.0049 |
| Ti | 0.0811 | 0.1435 | 0.1762 | 0.1493 | 0.0848 | 0.0797 | 0.0997 | 0.3386 | 0.5625 |
| V | 0.0016 | 0.0028 | 0.0035 | 0.0029 | 0.0017 | 0.0016 | 0.0020 | 0.0078 | 0.0126 |
| Zn | 0.0004 | 0.0008 | 0.0010 | 0.0009 | 0.0005 | 0.0005 | 0.0006 | 0.0016 | 0.0031 |
| Zr | 0.0162 | 0.0279 | 0.0341 | 0.0289 | 0.0168 | 0.0159 | 0.0197 | 0.0648 | 0.0987 |
| B | 0.0045 | 0.0048 | 0.0050 | 0.0047 | 0.0044 | 0.0045 | 0.0044 | 0.0031 | 0.0024 |

2.4.1.2 Results of Analysis

A sampling of the silicon at surface of the ingot yields the following information:

$$k_{eff} = (1-R) \cdot k_{th} + R$$

$$\frac{0.68\% \text{ Fe}}{1.37\% \text{ Fe}} = (1-R) \cdot 0.0000064 + R \text{ so,}$$

$$R = 0.50$$

The purification efficiency should be:

$[Fe]_{solid} = (1-0.50) \cdot 0.0000064 \cdot [Fe]_{liquid} + 0.50 \cdot [Fe]_{liquid} \approx 0.50 \cdot [Fe]_{liquid}$ $[P]_{solid} = (1-0.50) \cdot 0.35 \cdot [P]_{liquid} + 0.50 \cdot [P]_{liquid} = 0.68 \cdot [P]_{liquid}$ $[B]_{solid} = (1-0.50) \cdot 080 \cdot [B]_{liquid} + 0.50 \cdot [B]_{liquid} = 0.90 \cdot [B]_{liquid}$

TABLE 3

| Element | Theory $k_{eff}$ | Experimental $k_{eff}$ |
|---|---|---|
| Al | 0.50 | 0.46 |
| Ca | 0.50 | 0.43 |
| Co | 0.50 | 0.43 |
| Cr | 0.50 | 0.71 |
| Cu | 0.50 | 0.49 |
| Fe | 0.50 | 0.49 |
| Mg | 0.50 | 0.49 |
| Mn | 0.50 | 0.49 |
| Mo | 0.50 | 0.75 |

TABLE 3-continued

| Element | Theory $k_{eff}$ | Experimental $k_{eff}$ |
|---|---|---|
| Ni | 0.50 | 0.50 |
| P | 0.68 | 0.70 |
| Ti | 0.50 | 0.48 |
| V | 0.50 | 0.50 |
| Zr | 0.50 | 0.50 |
| B | 0.90 | 0.92 |

Experimental results show that about 50% of most of the elements may be removed from the upper part of the silicon ingot. This type of solidification may also remove about 30% of phosphorus and about 10% of boron from the upper part of the silicon ingot.

As seen in the graphs of FIGS. 8A to 8H, the more cool impurity-rich liquid silicon which is more dense accumulates at the bottom of the liquid found at the center of the ingot where it may be trapped by dendrite formation at the bottom of the ingot.

2.4.2 Experiment #2: Solidification with Electromagnetic Agitation

An experiment was carried out: unidirectional solidification in an insulated mould with electromagnetic stirring of the melt during solidification.

2.4.2.1 Ingot Sample

Figure 9:
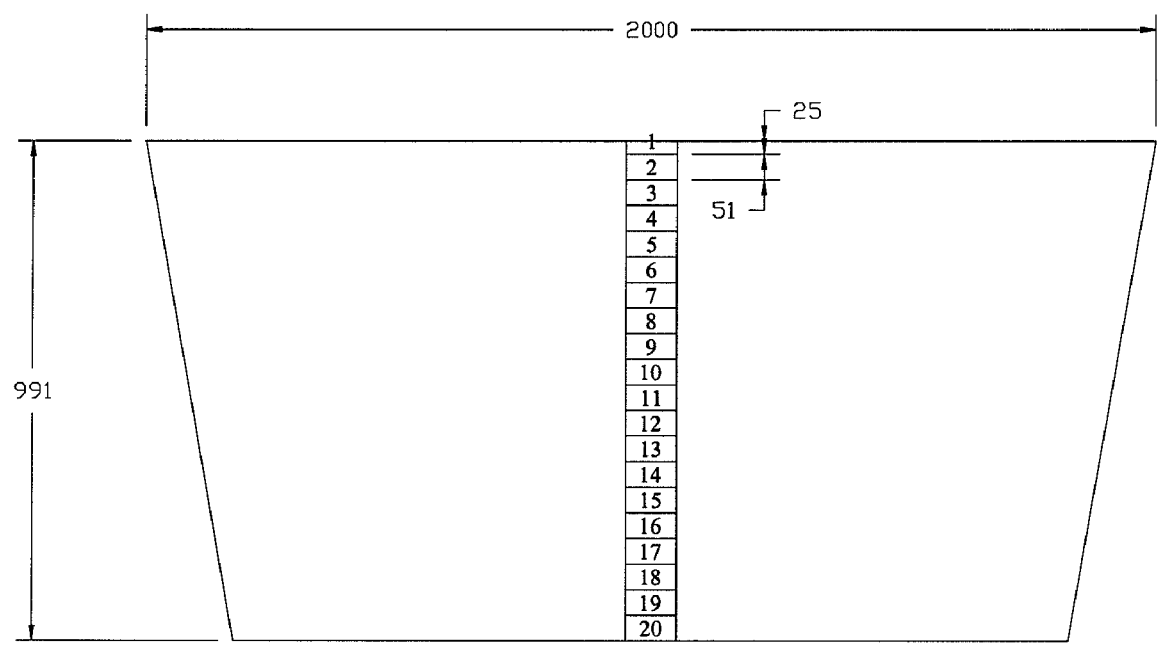
FIG. 9 is a graphical representation of the location within an ingot of samples analyzed for a solidification trial with electromagnetic stirring.
Figure 10A:
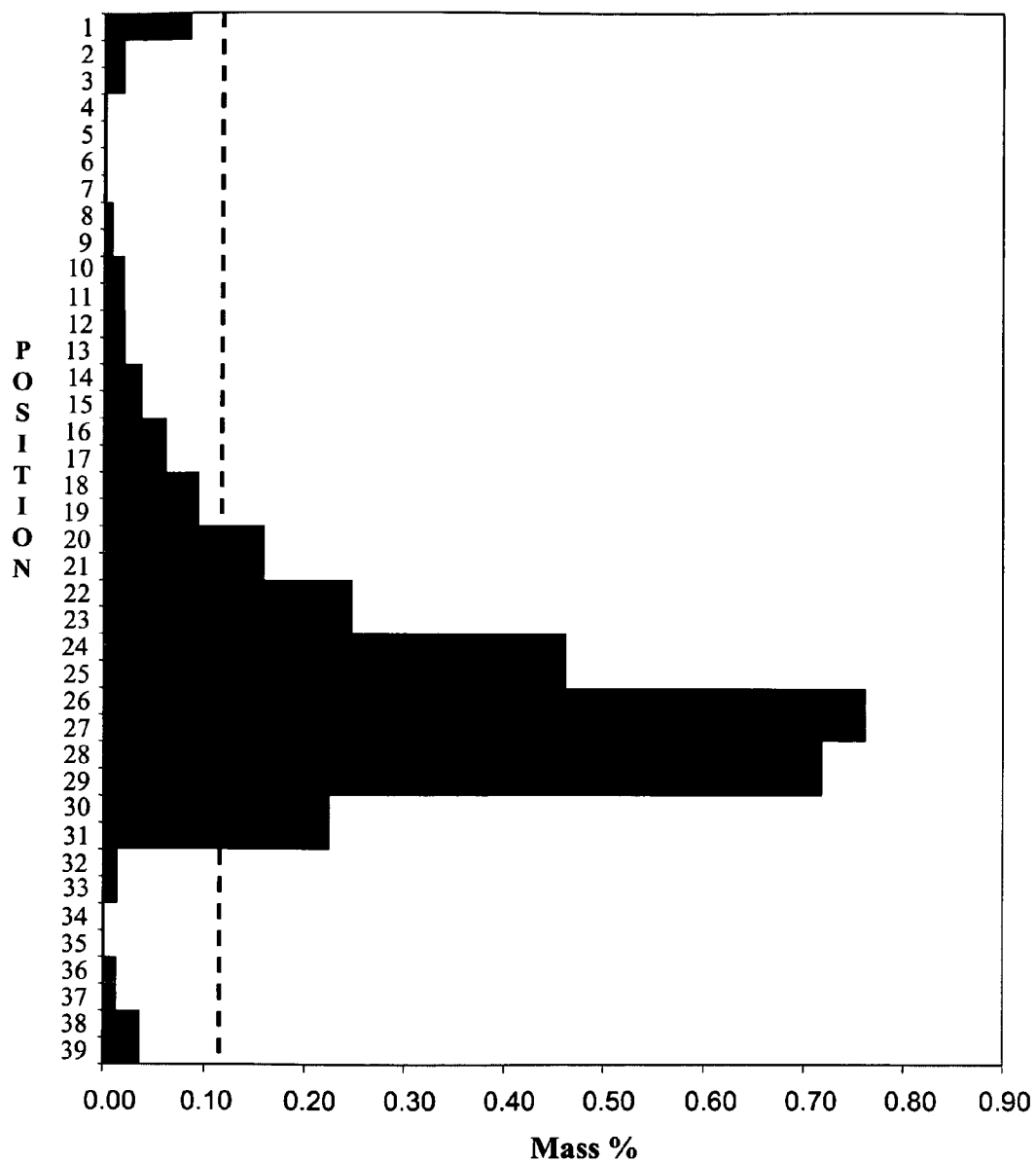
FIG. 10A to 10H are graphical representations for various elements of the elemental distribution as a function of the location in the ingot as depicted in FIG. 9.
Figure 10B:
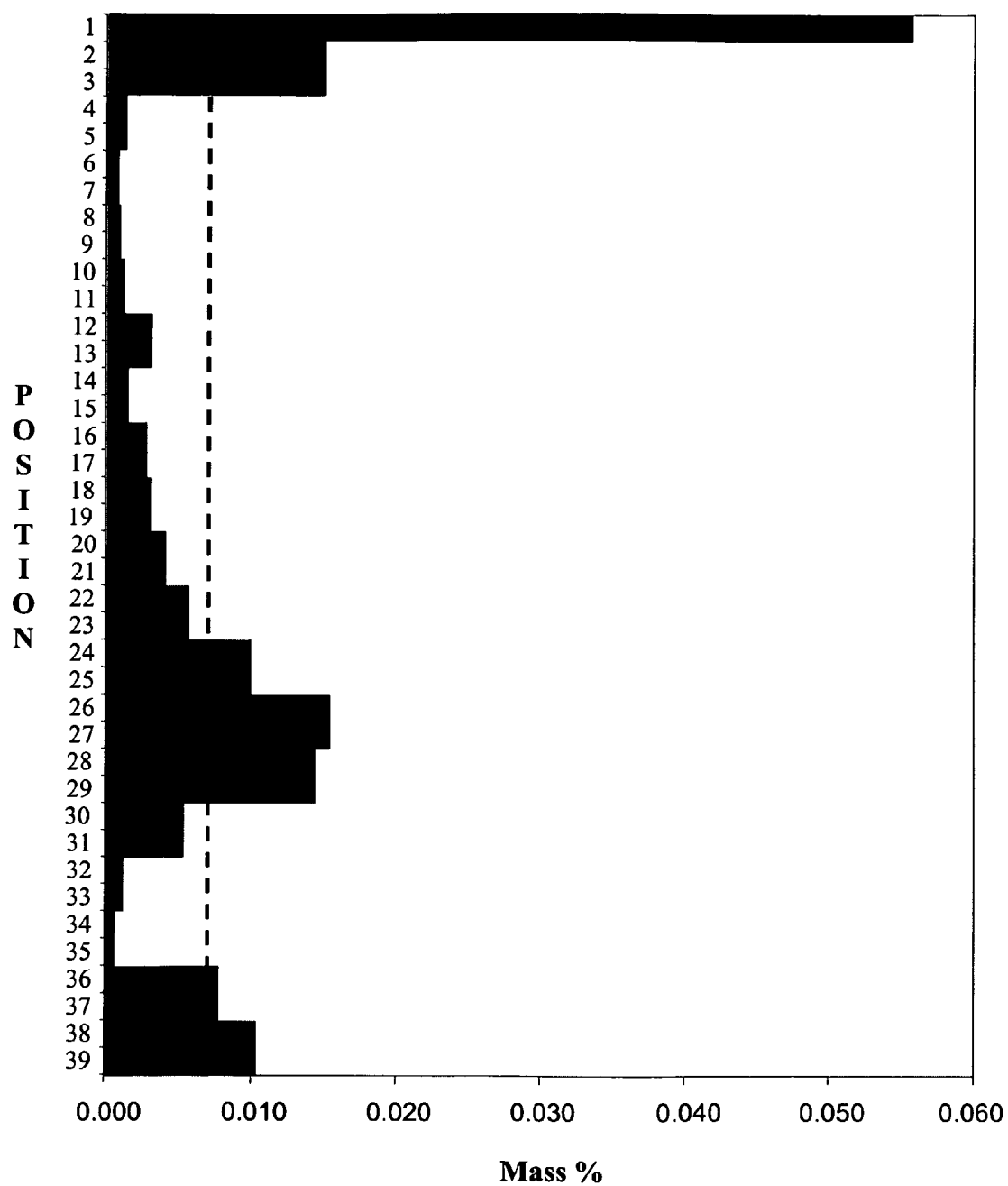
Figure 10C:
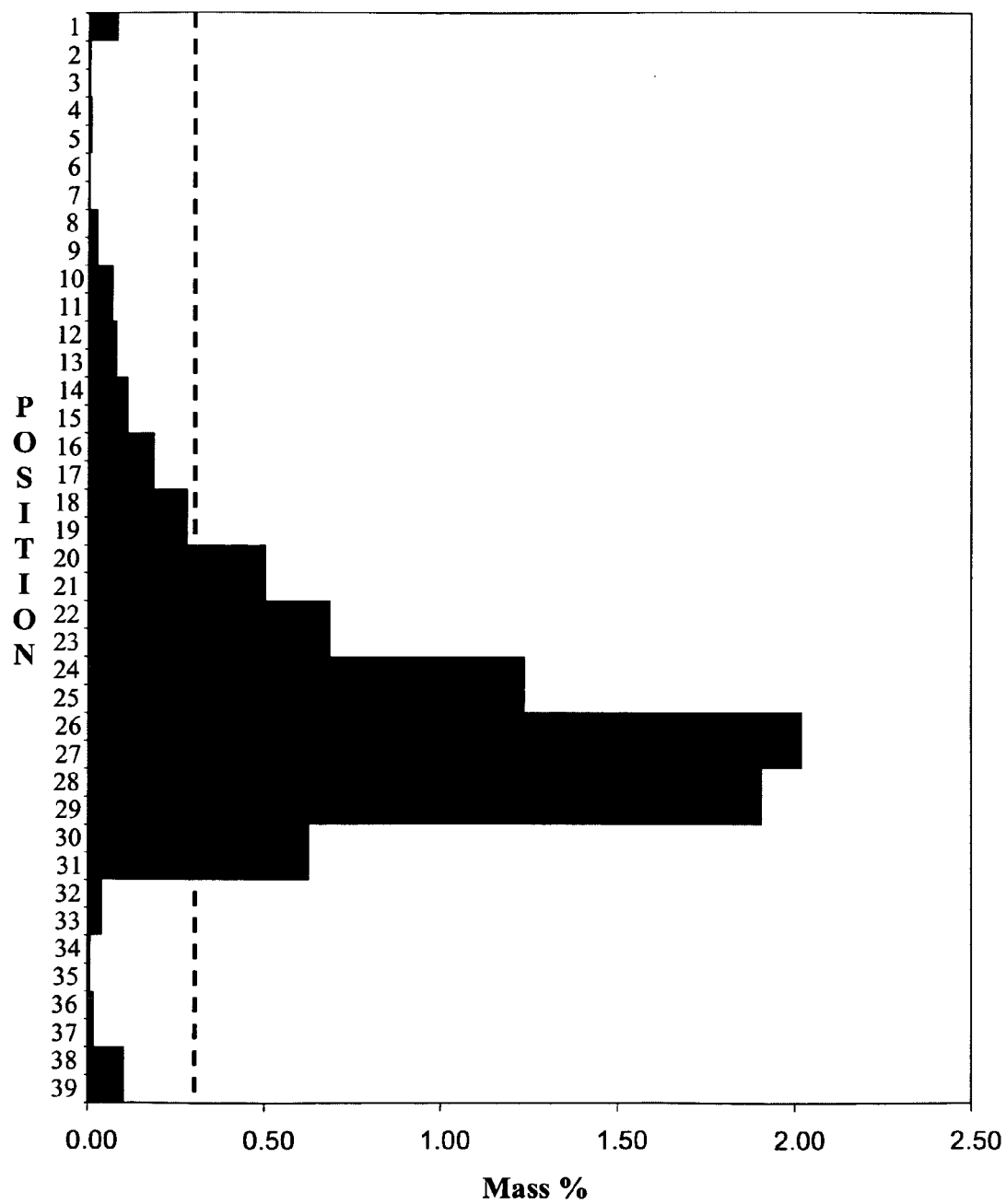
Figure 10D:
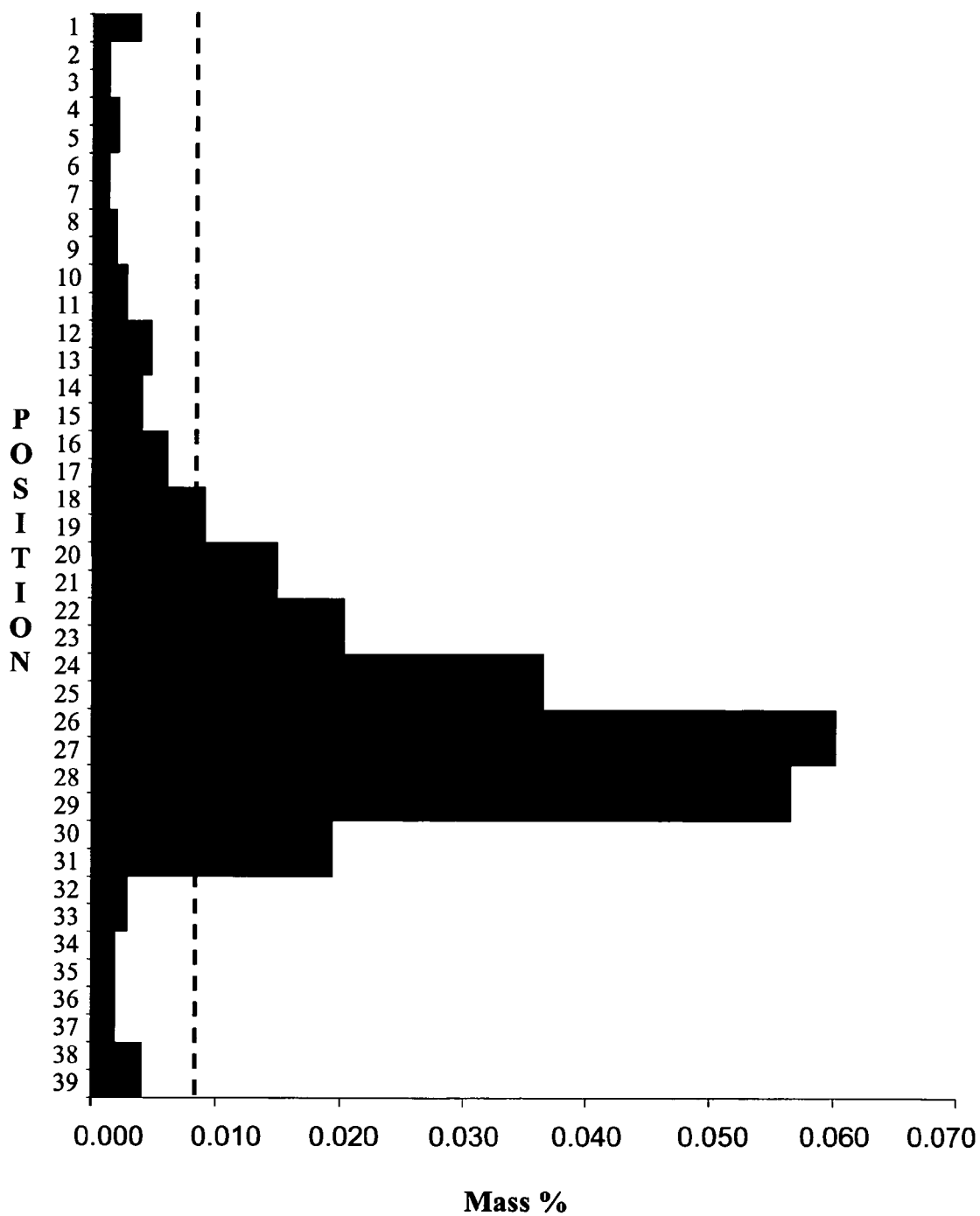
Figure 10E:
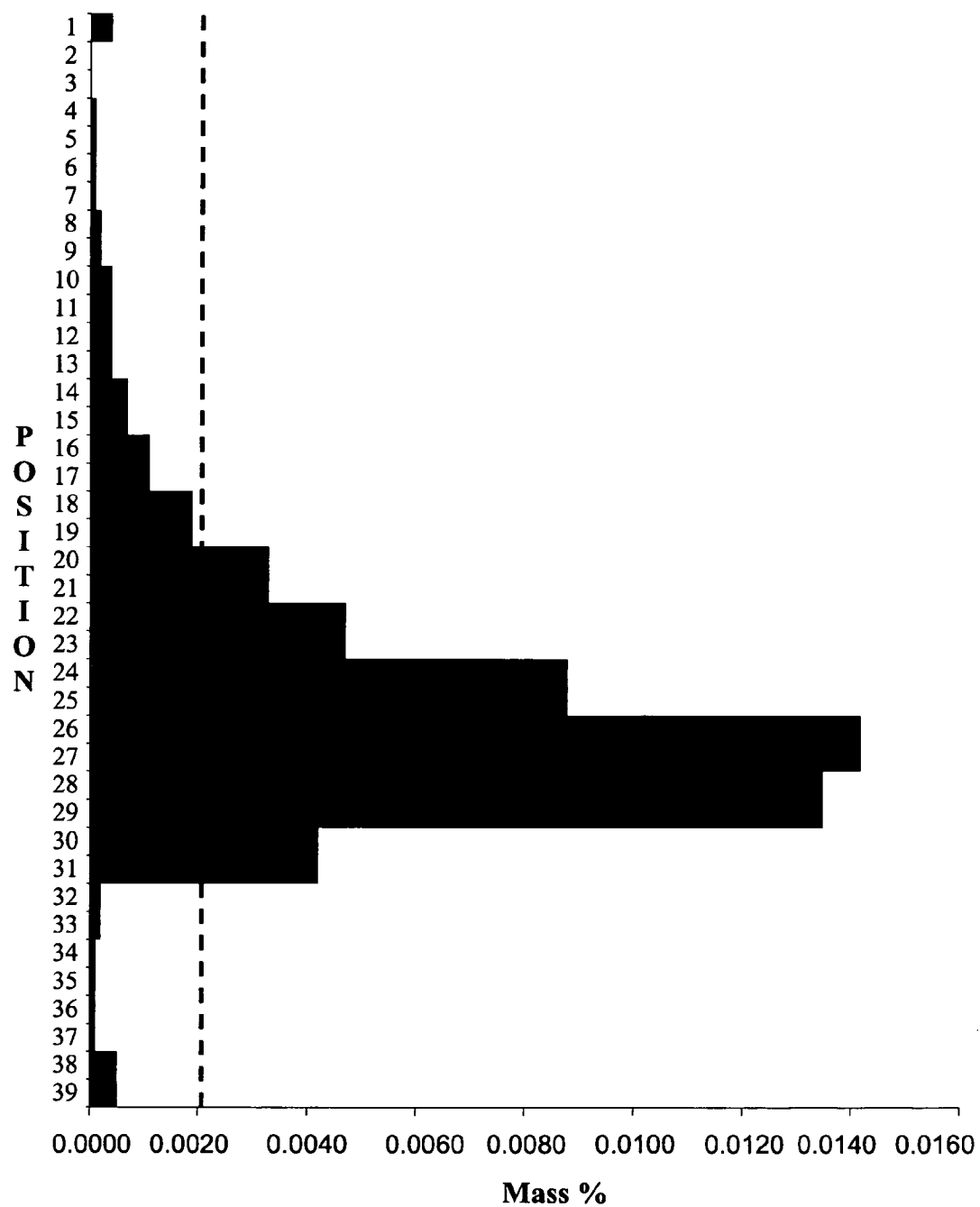
Figure 10F:
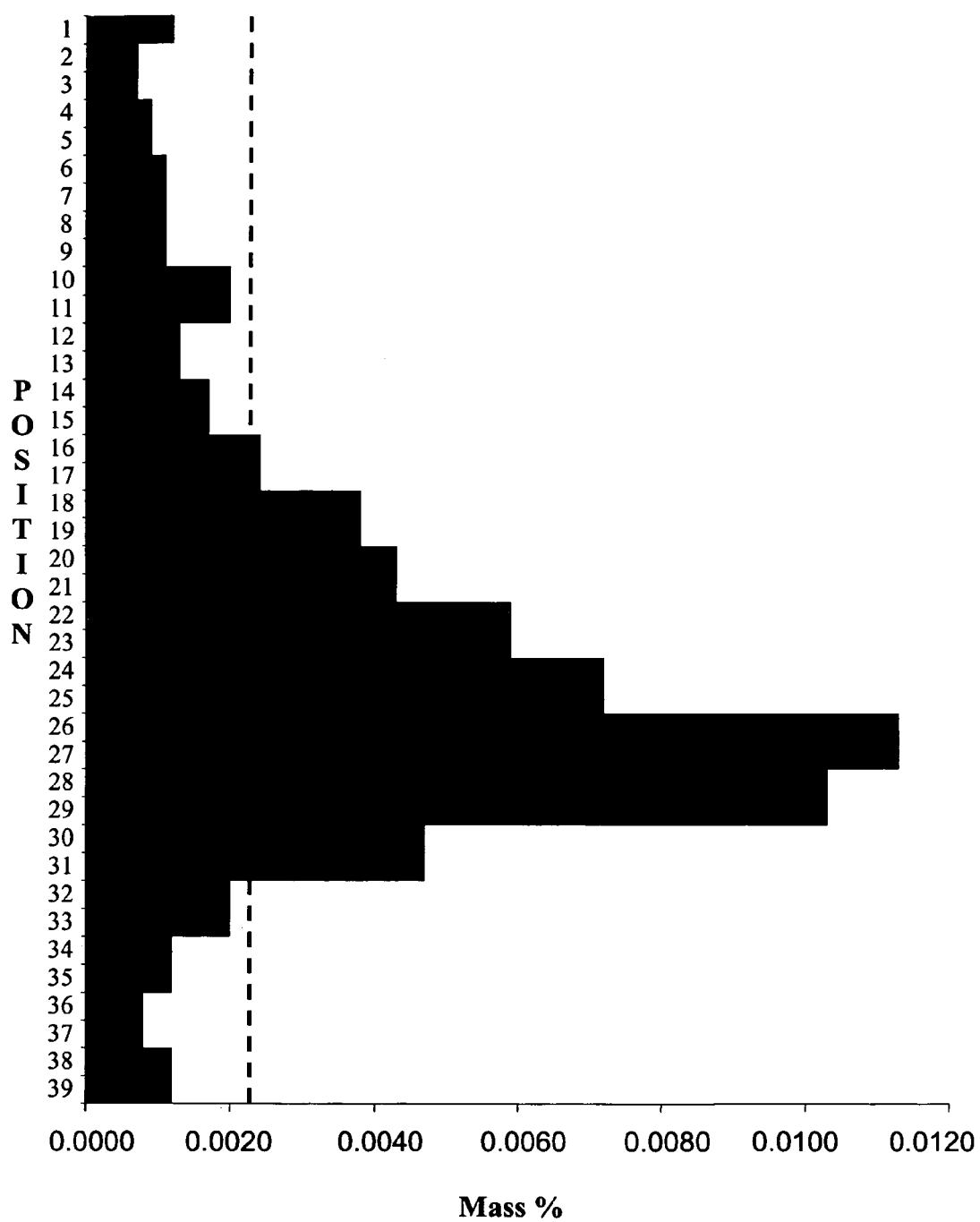
Figure 10G:
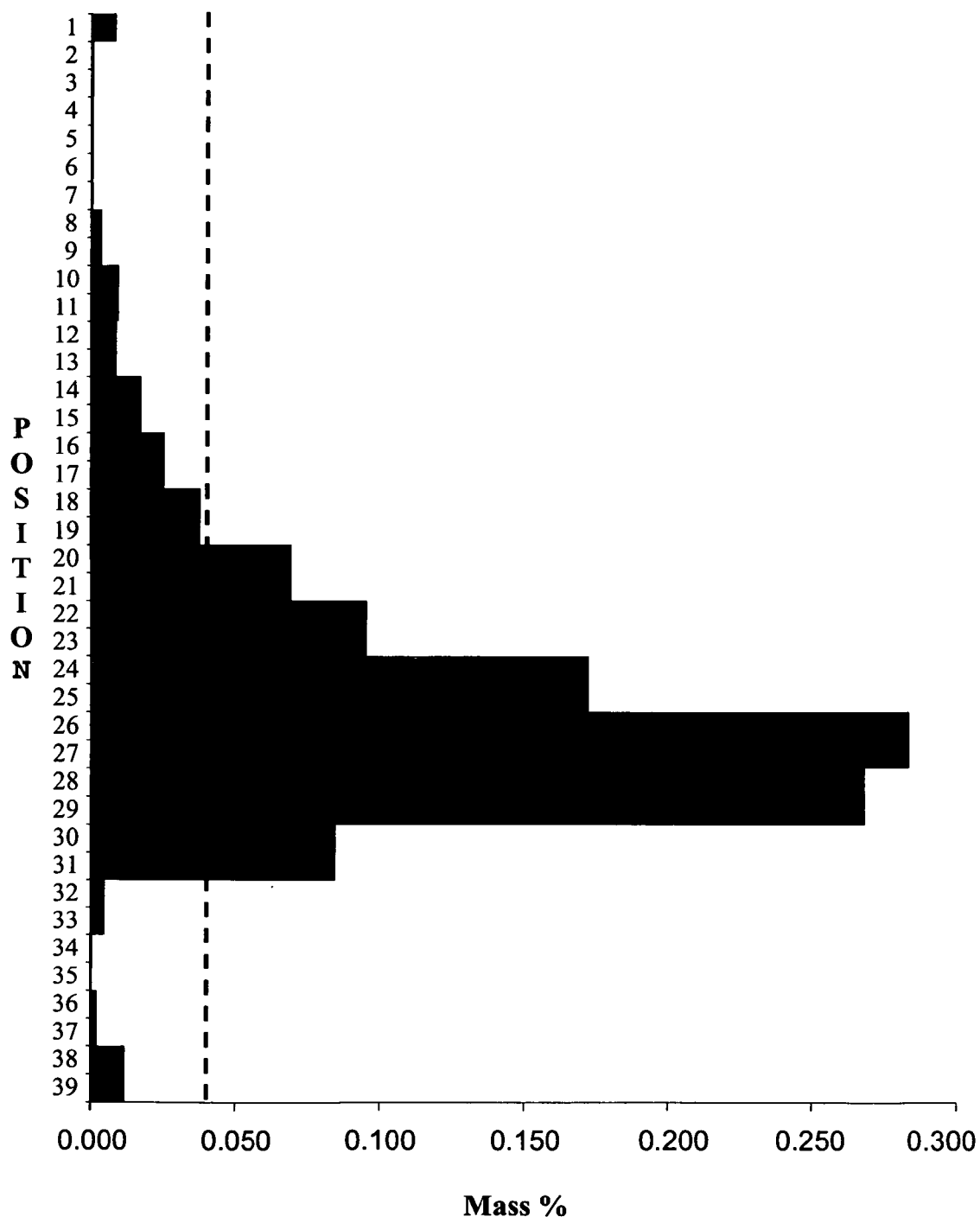
Figure 10H:
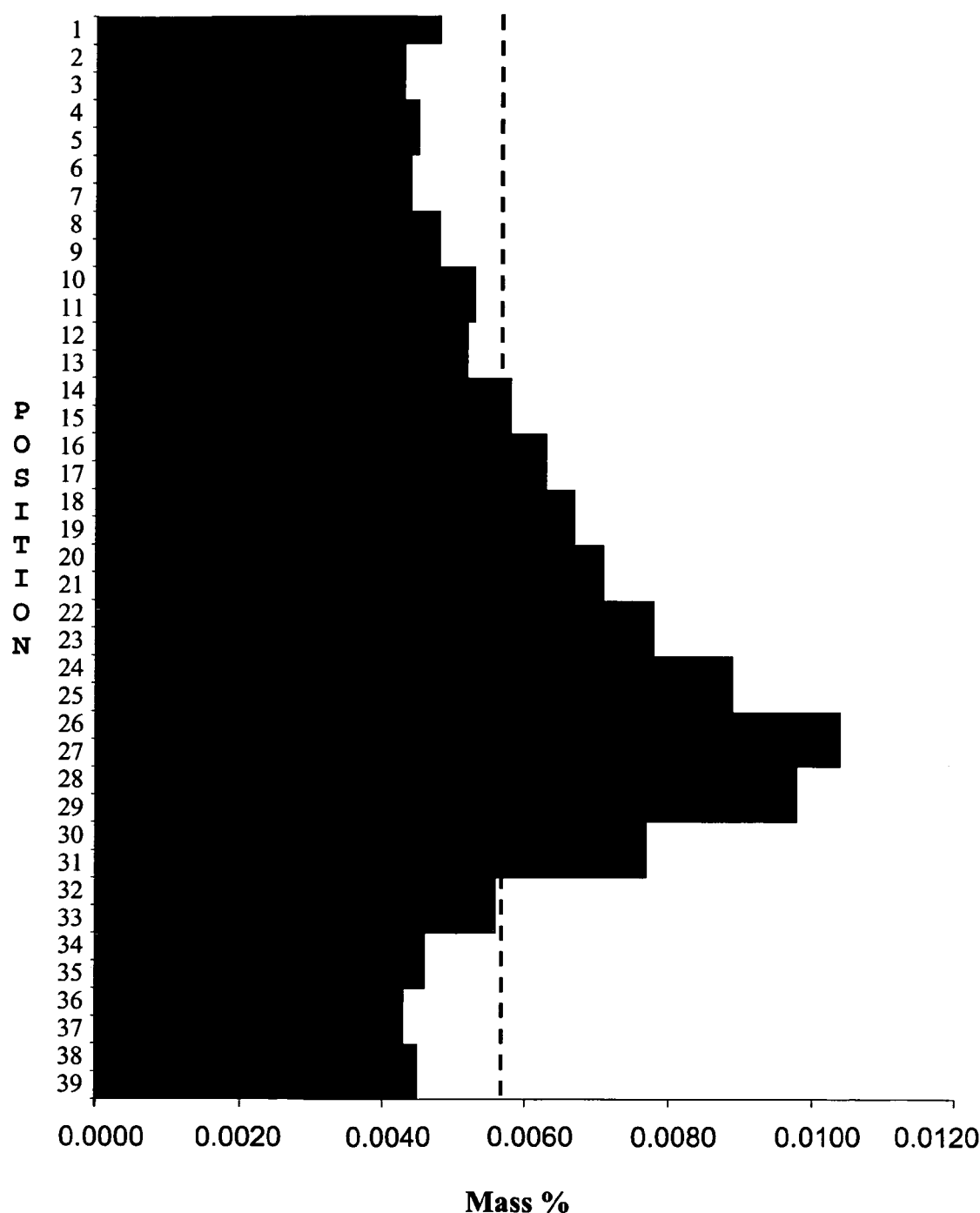

A sample was taken from the center of the ingot, according to the diagram shown in FIG. 9, and analyzed the results are given hereinbelow in Table 4. A graphical representation of the elemental impurity distribution in the ingot as a function of position in the ingot of several of the elements is shown in FIGS. 10A to 10H.

TABLE 4

| | Liq. | 1 | 2 | 3 | 4 | 5 | 6 | 7 | 8 | 9 | 10 |
|---|---|---|---|---|---|---|---|---|---|---|---|
| Al | 0.1184 | 0.0849 | 0.0185 | 0.0011 | 0.0007 | 0.0070 | 0.0194 | 0.0202 | 0.0366 | 0.0613 | 0.0942 |
| As | 0.0011 | 0.0006 | 0.0003 | 0.0006 | 0.0006 | 0.0001 | 0.0005 | 0.0007 | 0.0003 | 0.0011 | 0.0011 |
| Ba | 0.0001 | 0.0009 | 0.0004 | 0.0002 | 0.0002 | 0.0002 | 0.0002 | 0.0002 | 0.0002 | 0.0002 | 0.0002 |
| Bi | 0.0001 | 0.0001 | 0.0001 | 0.0001 | 0.0001 | 0.0001 | 0.0001 | 0.0000 | 0.0002 | 0.0002 | 0.0001 |
| Ca | 0.0072 | 0.0557 | 0.0150 | 0.0013 | 0.0008 | 0.0009 | 0.0012 | 0.0031 | 0.0015 | 0.0028 | 0.0031 |
| Cd | 0.0001 | 0.0001 | 0.0000 | 0.0000 | 0.0001 | 0.0001 | 0.0000 | 0.0001 | 0.0001 | 0.0001 | 0.0001 |
| Co | 0.0005 | 0.0008 | 0.0007 | 0.0006 | 0.0007 | 0.0006 | 0.0007 | 0.0007 | 0.0007 | 0.0008 | 0.0008 |
| Cr | 0.0014 | 0.0004 | 0.0001 | 0.0002 | 0.0001 | 0.0002 | 0.0004 | 0.0005 | 0.0006 | 0.0010 | 0.0014 |
| Cu | 0.0017 | 0.0018 | 0.0014 | 0.0015 | 0.0014 | 0.0015 | 0.0017 | 0.0017 | 0.0019 | 0.0023 | 0.0028 |
| Fe | 0.3053 | 0.0834 | 0.0051 | 0.0099 | 0.0038 | 0.0269 | 0.0704 | 0.0805 | 0.1141 | 0.1874 | 0.2817 |
| La | 0.0007 | 0.0008 | 0.0004 | 0.0004 | 0.0004 | 0.0005 | 0.0006 | 0.0006 | 0.0007 | 0.0008 | 0.0010 |
| Mg | 0.0004 | 0.0006 | 0.0001 | 0.0000 | 0.0000 | 0.0000 | 0.0001 | 0.0001 | 0.0001 | 0.0002 | 0.0003 |
| Mn | 0.0083 | 0.0038 | 0.0013 | 0.0021 | 0.0013 | 0.0019 | 0.0028 | 0.0048 | 0.0040 | 0.0061 | 0.0091 |
| Mo | 0.0001 | 0.0018 | 0.0009 | 0.0011 | 0.0004 | 0.0004 | 0.0010 | 0.0004 | 0.0008 | 0.0009 | 0.0010 |
| Na | 0.0000 | 0.0009 | 0.0009 | 0.0013 | 0.0009 | 0.0011 | 0.0009 | 0.0010 | 0.0008 | 0.0009 | 0.0008 |
| Ni | 0.0021 | 0.0004 | 0.0000 | 0.0001 | 0.0001 | 0.0002 | 0.0004 | 0.0004 | 0.0007 | 0.0011 | 0.0019 |
| P | 0.0023 | 0.0012 | 0.0007 | 0.0009 | 0.0011 | 0.0011 | 0.0020 | 0.0013 | 0.0017 | 0.0024 | 0.0038 |
| Pb | 0.0001 | 0.0000 | 0.0000 | 0.0001 | 0.0001 | 0.0000 | 0.0001 | 0.0002 | 0.0001 | 0.0000 | 0.0001 |
| Sb | 0.0008 | 0.0006 | 0.0003 | 0.0003 | 0.0002 | 0.0002 | 0.0003 | 0.0004 | 0.0005 | 0.0008 | 0.0010 |
| Sc | 0.0001 | 0.0005 | 0.0004 | 0.0004 | 0.0004 | 0.0004 | 0.0004 | 0.0004 | 0.0005 | 0.0005 | 0.0005 |
| Sn | 0.0001 | 0.0001 | 0.0001 | 0.0001 | 0.0001 | 0.0001 | 0.0001 | 0.0001 | 0.0001 | 0.0001 | 0.0001 |
| Sr | 0.0000 | 0.0004 | 0.0001 | 0.0000 | 0.0000 | 0.0000 | 0.0000 | 0.0000 | 0.0000 | 0.0000 | 0.0000 |
| Ti | 0.0409 | 0.0083 | 0.0004 | 0.0003 | 0.0003 | 0.0033 | 0.0093 | 0.0086 | 0.0172 | 0.0252 | 0.0378 |
| V | 0.0026 | 0.0006 | 0.0000 | 0.0000 | 0.0000 | 0.0002 | 0.0006 | 0.0006 | 0.0010 | 0.0016 | 0.0024 |
| Zn | 0.0007 | 0.0004 | 0.0001 | 0.0004 | 0.0002 | 0.0002 | 0.0003 | 0.0004 | 0.0005 | 0.0006 | 0.0008 |
| Zr | 0.0061 | 0.0013 | 0.0001 | 0.0000 | 0.0000 | 0.0005 | 0.0015 | 0.0014 | 0.0024 | 0.0039 | 0.0058 |
| B | 0.0057 | 0.0048 | 0.0043 | 0.0045 | 0.0044 | 0.0048 | 0.0053 | 0.0052 | 0.0058 | 0.0063 | 0.0067 |

| | 11 | 12 | 13 | 14 | 15 | 16 | 17 | 18 | 19 | 20 |
|---|---|---|---|---|---|---|---|---|---|---|
| Al | 0.1592 | 0.2481 | 0.4626 | 0.7623 | 0.7187 | 0.2259 | 0.0132 | 0.0011 | 0.0124 | 0.0357 |
| As | 0.0020 | 0.0027 | 0.0047 | 0.0077 | 0.0068 | 0.0027 | 0.0003 | 0.0002 | 0.0003 | 0.0006 |
| Ba | 0.0002 | 0.0002 | 0.0002 | 0.0003 | 0.0003 | 0.0002 | 0.0002 | 0.0002 | 0.0002 | 0.0003 |
| Bi | 0.0003 | 0.0003 | 0.0004 | 0.0007 | 0.0008 | 0.0004 | 0.0000 | 0.0000 | 0.0001 | 0.0001 |
| Ca | 0.0041 | 0.0057 | 0.0100 | 0.0154 | 0.0144 | 0.0054 | 0.0012 | 0.0006 | 0.0078 | 0.0104 |
| Cd | 0.0001 | 0.0001 | 0.0001 | 0.0001 | 0.0001 | 0.0001 | 0.0001 | 0.0000 | 0.0000 | 0.0001 |
| Co | 0.0009 | 0.0010 | 0.0013 | 0.0018 | 0.0017 | 0.0010 | 0.0006 | 0.0006 | 0.0006 | 0.0007 |
| Cr | 0.0025 | 0.0032 | 0.0058 | 0.0091 | 0.0087 | 0.0030 | 0.0003 | 0.0001 | 0.0002 | 0.0006 |
| Cu | 0.0042 | 0.0052 | 0.0084 | 0.0131 | 0.0125 | 0.0048 | 0.0016 | 0.0014 | 0.0014 | 0.0018 |
| Fe | 0.5029 | 0.6844 | 1.2379 | 2.0215 | 1.9060 | 0.6252 | 0.0421 | 0.0079 | 0.0192 | 0.1057 |
| La | 0.0016 | 0.0020 | 0.0031 | 0.0047 | 0.0044 | 0.0018 | 0.0005 | 0.0004 | 0.0005 | 0.0007 |
| Mg | 0.0005 | 0.0007 | 0.0014 | 0.0023 | 0.0022 | 0.0007 | 0.0001 | 0.0000 | 0.0001 | 0.0004 |
| Mn | 0.0149 | 0.0203 | 0.0366 | 0.0602 | 0.0566 | 0.0194 | 0.0029 | 0.0019 | 0.0019 | 0.0041 |
| Mo | 0.0016 | 0.0017 | 0.0018 | 0.0033 | 0.0025 | 0.0012 | 0.0003 | 0.0001 | 0.0001 | 0.0001 |
| Na | 0.0008 | 0.0007 | 0.0005 | 0.0007 | 0.0005 | 0.0008 | 0.0011 | 0.0010 | 0.0024 | 0.0017 |
| Ni | 0.0033 | 0.0047 | 0.0088 | 0.0142 | 0.0135 | 0.0042 | 0.0002 | 0.0001 | 0.0001 | 0.0005 |
| P | 0.0043 | 0.0059 | 0.0072 | 0.0113 | 0.0103 | 0.0047 | 0.0020 | 0.0012 | 0.0008 | 0.0012 |
| Pb | 0.0001 | 0.0003 | 0.0001 | 0.0006 | 0.0005 | 0.0000 | 0.0001 | 0.0001 | 0.0001 | 0.0001 |
| Sb | 0.0017 | 0.0020 | 0.0039 | 0.0059 | 0.0054 | 0.0020 | 0.0003 | 0.0001 | 0.0001 | 0.0005 |
| Sc | 0.0005 | 0.0006 | 0.0006 | 0.0008 | 0.0008 | 0.0006 | 0.0004 | 0.0004 | 0.0004 | 0.0005 |
| Sn | 0.0001 | 0.0001 | 0.0001 | 0.0001 | 0.0001 | 0.0001 | 0.0001 | 0.0001 | 0.0001 | 0.0001 |
| Sr | 0.0000 | 0.0000 | 0.0000 | 0.0001 | 0.0000 | 0.0000 | 0.0000 | 0.0000 | 0.0001 | 0.0001 |
| Ti | 0.0695 | 0.0956 | 0.1726 | 0.2838 | 0.2686 | 0.0849 | 0.0047 | 0.0003 | 0.0020 | 0.0119 |
| V | 0.0044 | 0.0058 | 0.0106 | 0.0171 | 0.0164 | 0.0053 | 0.0003 | 0.0000 | 0.0001 | 0.0007 |
| Zn | 0.0012 | 0.0017 | 0.0030 | 0.0049 | 0.0046 | 0.0016 | 0.0003 | 0.0001 | 0.0002 | 0.0003 |
| Zr | 0.0105 | 0.0141 | 0.0251 | 0.0399 | 0.0379 | 0.0127 | 0.0007 | 0.0000 | 0.0003 | 0.0021 |
| B | 0.0071 | 0.0078 | 0.0089 | 0.0104 | 0.0098 | 0.0077 | 0.0056 | 0.0046 | 0.0043 | 0.0045 |

2.4.2.2 Results of Analysis

Electromagnetic agitation had a large effect on the distribution of impurities in the silicon ingot. The agitation prevented the separation of impurities towards the bottom of the silicon ingot. Moreover, there was a large increase in the segregation of impurities (the surface layer is much more pure).

A sampling of the silicon at surface of the ingot yields the following information:

$$k_{eff} = (1-R) \cdot k_{th} + R$$

$$\frac{0.0051\% \text{ Fe}}{0.305\% \text{ Fe}} = (1-R) \cdot 0.0000064 + R \text{ so,}$$
$$R = 0.017 \approx 0.02$$

In theory, the efficiency of the purification is:

$[Fe]_{solid} = (1-0.02) \cdot 0.0000064 \cdot [Fe]_{liquid} + 0.02 \cdot [Fe]_{liquid} = 0.02 \cdot [Fe]_{liquid}$ $[P]_{solid} = (1-0.02) \cdot 0.35 \cdot [P]_{liquid} + 0.02 \cdot [P]_{liquid} = 0.36 \cdot [P]_{liquid}$ $[B]_{solid} = (1-0.02) \cdot 0.80 \cdot [B]_{liquid} + 0.02 \cdot [B]_{liquid} = 0.80 \cdot [B]_{liquid}$

TABLE 5

| Element | Theory $k_{eff}$ | Experimental $k_{eff}$ |
|---|---|---|
| Al | 0.02 | 0.01 |
| Ca | 0.02 | 0.18 |

TABLE 5-continued

| Element | Theory $k_{eff}$ | Experimental $k_{eff}$ |
|---|---|---|
| Co | 0.02 | — |
| Cr | 0.02 | 0.07 |
| Cu | 0.02 | — |
| Fe | 0.02 | 0.02 |
| Mg | 0.02 | — |
| Mn | 0.02 | 0.16 |
| Mo | 0.02 | — |
| Ni | 0.02 | 0.05 |
| P | 0.36 | 0.39 |
| Ti | 0.02 | 0.01 |
| V | 0.02 | — |
| Zr | 0.02 | — |
| B | 0.80 | 0.79 |

These results show that we can expect to obtain a very pure layer (approximately 30 cm thick at the top surface of the ingot) upon partial solidification of the silicon melt. This should correspond to a solidification time of approximately 4.5 hours with air-cooling at the open top of the ingot.

The experiments conducted showed that the ingot obtained with agitation of the melt during solidification of the melt developed a lot more cracks than the ingot obtained without agitation of the melt during solidification of the melt. Each crack can lead to a small amount of contamination caused by an intrusion of impure metal into the "purified" zone. However, this cracking should be lessened by not solidifying completely the melt.

A more homogeneous liquid is obtained with electromagnetic agitation (i.e., electromagnetic stirring) of the melt during solidification of the melt.

According to the results obtained, this procedure may be capable of removing more than 50% of phosphorus and makes the method very interesting for the production of Solar Grade silicon from Metallurgic Grade silicon.

The solidification speed may range between $10^{-6}$ m/s and $10^{-4}$ m/s. High solidification speeds may be achieved with this method as compared with other crystallization methods. This provides a cost effective solution for mass production of high-purity silicon.

The outer layer (first skin of silicon) of the ingot freezes rapidly, relieving the heat in excess. Then the temperature of the liquid silicon drops to approximately 1410° C. At this moment, we obtain the minimum solubility values for carbon and oxygen.

Analytical results of the liquid center of the ingot confirm a carbon content of less than 60 ppmw and an oxygen content of less than 20 ppmw. Analysis done by an external laboratory confirmed a carbon content of less than 20 ppmw and an oxygen content of less than 20 ppmw. Advantageously, we have now a new process that produces a grade of silicon with low-carbon and low-oxygen content.

The invention claimed is:

1. A batch casting process for purifying low-purity metallurgical grade silicon, containing at least one of the following contaminants Al, As, Ba, Bi, Ca, Cd, Fe, Co, Cr, Cu, Fe, La, Mg, Mn, Mo, Na, Ni, P, Pb, Sb, Sc, Sn, Sr, Ti, V, Zn, Zr, and B, and obtaining a higher-purity solid polycrystalline silicon, said process comprising the steps of:
   a. containing a melt of low-purity metallurgical grade silicon in a mould, said mould having an insulated bottom wall, insulated side walls, and an open top;
   b. solidifying the melt by unidirectional solidification from said open top towards said insulated bottom wall of said mould while electromagnetically stirring the melt so as to wash a solidification interface and prevent impurity rich liquid to be trapped by dendrite formation;
   c. controlling a rate of said unidirectional solidification;
   d. stopping said unidirectional solidification when the melt has partially solidified to produce an ingot having an exterior shell comprising said higher-purity solid polycrystalline silicon and a center comprising an impurity-enriched liquid silicon; and
   e. creating an opening in said exterior shell of said ingot to outflow said impurity-enriched liquid silicon and leave the exterior shell comprising said higher-purity solid polycrystalline silicon thereby obtaining said higher-purity solid polycrystalline silicon.

2. A process according to claim 1, wherein said insulated bottom wall and said insulated side walls are heated to minimize a formation of a skin of silicon on said insulated bottom wall and said insulated side walls of said mould.

3. A process according to claim 1, wherein said rate of unidirectional solidification is controlled by an insulation of said insulated bottom wall and said insulated side walls.

4. A process according to claim 1, wherein said rate of unidirectional solidification is controlled by controlling a rate of heat extraction from the melt at said open top of said mould.

5. A process according to claim 4, wherein said controlling a rate of heat extraction comprises placing a cooling medium in contact with a free surface of the melt at said open top of said mould.

6. A process according to claim 5, wherein said cooling medium is water or air.

7. A process according to claim 1, wherein said rate of unidirectional solidification is determined so as to minimize dendrite formation.

8. A process according to claim 7, wherein said rate of unidirectional solidification is less than $1\times10^4$ m/s.

9. A process according to claim 7, wherein said rate of unidirectional solidification is comprised between $1\times10^4$ m/s and $5\times10^6$ m/s.

10. A process according to claim 1, wherein said stopping the unidirectional solidification is done when 40 to 80% of the melt has solidified.

11. A process according to claim 1, wherein said creating an opening in said exterior shell of said ingot of step (e) comprises piercing said exterior shell of said ingot by mechanical means or thermal lance.

12. A process according to claim 11, wherein said impurity-enriched liquid silicon flowing out of the ingot is extracted from the mould through a tap opening in said mould.

13. A process according to claim 1, wherein said process further comprises an additional step before step (e) of removing said ingot from said mould.

14. A process according to claim 1, wherein said process further comprises an additional step (f) of melting said higher-purity solid polycrystalline silicon and repeating steps (b) to (e).

15. A process according to claim 1, wherein a top portion of said higher-purity solid polycrystalline silicon contains at least 90% less metal contaminants Al, As, Ba, Bi, Ca, Cd, Co, Cr, Cu, Fe, K, La, Mg, Mn, Mo, Na, Ni, Pb, Sb, Sc, Sn, Sr, Ti, V, Zn, and Zr than the low-purity metallurgical grade silicon.

16. A process according to claim 1, wherein said higher-purity solid polycrystalline silicon contains approximately at least 45% less phosphorus and approximately at least 10% less boron than the low-purity metallurgical grade silicon.

17. A process according to claim 1, wherein said impurity-enriched liquid silicon contains less than 60 ppm of carbon and less than 20 ppm of oxygen and is a low carbon and low oxygen grade of silicon.

18. A process according to claim 13, wherein the step of removing said ingot from said mould includes the step of lifting the into out of the mould using a suspension mechanism.

* * * * *